(12) United States Patent
Narita et al.

(10) Patent No.: US 8,890,334 B2
(45) Date of Patent: Nov. 18, 2014

(54) SEMICONDUCTOR DEVICE, A MOBILE COMMUNICATION DEVICE, AND A METHOD FOR MANUFACTURING A SEMICONDUCTOR DEVICE

(71) Applicant: Renesas Electronics Corporation, Kawasaki (JP)

(72) Inventors: Toru Narita, Tsuruta (JP); Teruhito Takeuchi, Tsuruta (JP); Joichi Saito, Tsuruta (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/951,424

(22) Filed: Jul. 25, 2013

(65) Prior Publication Data

US 2014/0027906 A1    Jan. 30, 2014

(30) Foreign Application Priority Data

Jul. 26, 2012    (JP) ................................. 2012-166265

(51) Int. Cl.
| | |
|---|---|
| *H01L 23/48* | (2006.01) |
| *H01L 21/00* | (2006.01) |
| *H01L 23/00* | (2006.01) |
| *H01L 25/065* | (2006.01) |
| *H01L 21/56* | (2006.01) |

(52) U.S. Cl.
CPC ....... *H01L 24/03* (2013.01); *H01L 2924/13064* (2013.01); *H01L 24/10* (2013.01); *H01L 25/0652* (2013.01); *H01L 2924/13091* (2013.01); *H01L 21/568* (2013.01); *H01L 23/00* (2013.01); *H01L 24/02* (2013.01); *H01L 21/561* (2013.01)

USPC ........... 257/777; 257/780; 257/783; 257/784; 257/E23.024; 257/E25.006; 438/109; 438/112; 438/118

(58) Field of Classification Search
USPC .......................................... 257/777; 438/109
See application file for complete search history.

(56) References Cited

U.S. PATENT DOCUMENTS

| | | | | |
|---|---|---|---|---|
| 6,333,562 | B1 * | 12/2001 | Lin ................................ | 257/777 |
| 6,545,365 | B2 | 4/2003 | Kondo et al. | |
| 7,385,296 | B2 | 6/2008 | Ohta | |
| 7,687,898 | B2 * | 3/2010 | Hung et al. .................... | 257/686 |
| 8,709,872 | B2 * | 4/2014 | Rofougaran ................... | 438/109 |
| 2002/0096755 | A1 | 7/2002 | Fukui et al. | |

FOREIGN PATENT DOCUMENTS

| | | |
|---|---|---|
| JP | 2001-308262 A | 11/2001 |
| JP | 2002-222913 A | 8/2002 |
| JP | 2006-084200 A | 3/2006 |
| JP | 2006-128169 A | 5/2006 |
| JP | 2008-192971 A | 8/2008 |
| JP | 2010-267685 A | 11/2010 |

\* cited by examiner

*Primary Examiner* — Jasmine Clark
(74) *Attorney, Agent, or Firm* — Miles & Stockbridge P.C.

(57) ABSTRACT

There is reduced the difference in inductance between bonding wires to be coupled to two semiconductor chips stacked one over another. A semiconductor device includes external terminals, lower and upper semiconductor chips, and first and second bonding wires. The lower semiconductor chip has first bonding pads, and the upper semiconductor chip has second bonding pads. The first bonding wire couples the first bonding pad of the lower semiconductor chip and the external terminal, and the second bonding wire couples the second bonding pad of the upper semiconductor chip and the external terminal. The diameter of the second bonding wire is larger than the diameter of the first bonding wire.

20 Claims, 24 Drawing Sheets

SEMICONDUCTOR DEVICE, A MOBILE COMMUNICATION DEVICE, AND A METHOD FOR MANUFACTURING A SEMICONDUCTOR DEVICE

CROSS-REFERENCE TO RELATED APPLICATIONS

The disclosure of Japanese Patent Application No. 2012-166265 filed on Jul. 26, 2012 including the specification, drawings and abstract is incorporated herein by reference in its entirety.

BACKGROUND

The present invention relates to a semiconductor device, a mobile communication device, and a method for manufacturing a semiconductor device. More particularly, it relates to a technology effectively applicable to the package structure of a semiconductor device (or a semiconductor integrated circuit device).

A semiconductor device including a plurality of semiconductor chips sealed in one package like a so-called SIP (system in package) is widely adopted as a technology for implementing a low-cost high-performance semiconductor device. Then, in order to implement the reduction in size of such a semiconductor device, generally, the structure in which over a semiconductor chip, another semiconductor chip is stacked is regarded as being effective. Thus, various studies have been made on the lamination structure of semiconductor chips.

For example, in Japanese Unexamined Patent Publication No. 2002-222913 (Patent Document 1), and its corresponding US patent No. 2002-96755 A (Patent Document 2), there is disclosed a technology of implementing multilayer die bonding whereby the flatness of each chip is ensured when mainly the semiconductor chips with the same size are stacked and mounted in a package. With this technology, after the completion of wire bonding of the lower chip, the upper chip having a die bonding adhesive layer at the bottom surface is pressed thereagainst from thereabove. As a result, the two chips are stacked one over another.

In Japanese Unexamined Patent Publication No. 2001-308262 (Patent Document 3), and its corresponding U.S. Pat. No. 6,545,365 (Patent Document 4), there is disclosed a technology of preventing a short circuit between a bonding wire and a chip after the completion of wire bonding of the lower chip when semiconductor chips are stacked and mounted in a package. With this technology, a sufficient amount of a die bonding resin is coated on the top surface of the lower chip, and an upper chip is disposed thereover. As a result, multilayer die bonding is implemented.

In Japanese Unexamined Patent Publication No. 2006-128169 (Patent Document 5), there is disclosed a technology of effectively preventing a short circuit between a wire and an upper chip, and a short circuit between wires when mainly the semiconductor chips with the same size are stacked and mounted in a package. With this technology, after the completion of wire bonding of the lower chip, the upper chip having a die bonding adhesive layer at the bottom surface is pressed thereagainst from thereabove. The die bonding adhesive layer includes an upper half layer into which a wire is less likely to penetrate, and a lower half layer into which a wire tends to penetrate.

In addition, for various objects, there is also disclosed a technology using bonding wires having different diameters as bonding wires coupled to a semiconductor chip in a package.

For example, in Japanese Unexamined Patent Publication No. 2006-84200 (Patent Document 6), there is disclosed a sensor device configured such that a sensor chip is stacked over a circuit chip via an adhesive. In this publication, there is disclosed a technology of setting the diameters of some of bonding wires for coupling a circuit chip and a sensor chip larger than those of other bonding wires in order to suppress fluctuations in sensor characteristics caused by the displacement of the sensor chip.

Whereas, in Japanese Unexamined Patent Publication No. 2008-192971 (Patent Document 7), there is disclosed a semiconductor device in which a memory chip is stacked over a mounting substrate, and a microcomputer chip is stacked over the memory chip. This publication discloses a technology of providing a semiconductor device which has implemented high integration and high reliability with a simple configuration. More specifically, there is disclosed a configuration in which the bonding wire for coupling the mounting substrate and the memory chip, and the bonding wire for coupling the memory chip and the microcomputer chip are larger in thickness than the bonding wire for coupling the microcomputer chip and the mounting substrate.

Further, in Japanese Unexamined Patent Publication No. 2010-267685 (Patent Document 8), there is disclosed a technology for reducing the size of a power module and providing a semiconductor device having a high mechanical reliability. In this publication, a plurality of switching elements are stored in one packaging case. The semiconductor device includes a first metal thin line and a second metal wire disposed generally in parallel to each other. The first metal thin line is larger in line diameter and longer than the second metal wire. However, in the semiconductor device disclosed in this publication, a plurality of semiconductor chips are not stacked, and are disposed side by side.

PATENT DOCUMENTS

[Patent Document 1] Japanese Unexamined Patent Publication No. 2002-222913
[Patent Document 2] US patent No. 2002-96755 A
[Patent Document 3] Japanese Unexamined Patent Publication No. 2001-308262
[Patent Document 4] U.S. Pat. No. 6,545,365
[Patent Document 5] Japanese Unexamined Patent Publication No. 2006-128169
[Patent Document 6] Japanese Unexamined Patent Publication No. 2006-84200
[Patent Document 7] Japanese Unexamined Patent Publication No. 2008-192971
[Patent Document 8] Japanese Unexamined Patent Publication No. 2010-267685

SUMMARY

The present inventors conducted a study on the following configuration of a semiconductor device including a plurality of semiconductor chips stacked therein: electrodes serving as external terminals (most typically, leads) and respective semiconductor chips are electrically coupled via bonding wires. As a result, they found the following problem.

A difference is caused in inductance between the bonding wire coupled to the upper semiconductor chip and the bonding wire coupled to the lower semiconductor chip. This is due to the following fact: the length of the bonding wire to be electrically coupled with the semiconductor chip disposed on the upper side is larger than the length of the bonding wire to be electrically coupled with the semiconductor chip disposed on the lower side by the thickness of the semiconductor chip disposed on the lower side. The difference in inductance may be a problem in mounting. For example, the difference in inductance may cause a difference between the delay of the signal supply from the external terminal to the upper semiconductor chip and the delay of the signal supply from the external terminal to the lower semiconductor chip. Accordingly, the difference in inductance may be required to be subjected to some technical treatment. Particularly, when the upper semiconductor chip and the lower semiconductor chip have the same function/characteristics, and perform the same operation, the difference in inductance between the bonding wires may become remarkable.

Other problems and novel features will be apparent from the description of this specification and the accompanying drawings.

In one embodiment, a semiconductor device includes first and second semiconductor chips, first and second external terminals, and first and second bonding wires. The first semiconductor chip has a first front side main surface and a first back side main surface, and a first bonding pad over the first front side main surface. The second semiconductor chip has a second front side main surface and a second back side main surface, has a second bonding pad over the second front side main surface, and is disposed such that the second back side main surface faces the first front side main surface of the first semiconductor chip. The first and second external terminals are disposed so as to be closer to the first front side main surface of the first semiconductor chip than to the second front side main surface of the second semiconductor chip. The first bonding wire couples the first bonding pad and the first external terminal, and the second bonding wire couples the second bonding pad and the second external terminal. Herein, the diameter of the second bonding wire is larger than the diameter of the first bonding wire.

In accordance with the embodiment, it is possible to reduce the difference in inductance between the bonding wire to be coupled to one of the two semiconductor chips stacked one over another and the bonding wire to be coupled to the other.

DETAILED DESCRIPTION

Figure 1:
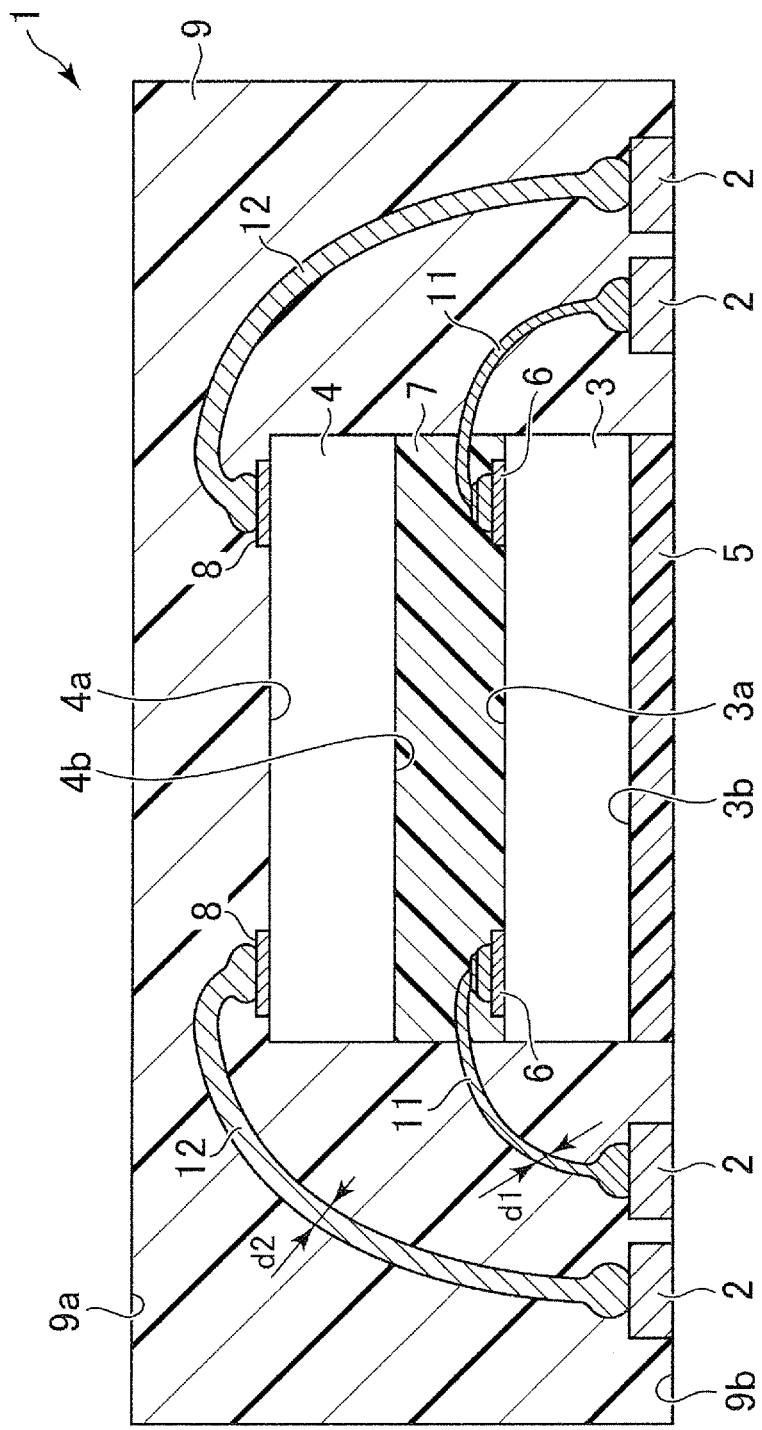
FIG. 1 is a cross-sectional view showing a structure of a semiconductor device of one embodiment.

[Explanation of Description Form, Basic Terms, and Methods in the Present Invention]

1. In the present invention, the embodiment may be described in a plurality of divided sections for convenience, if required. However, unless otherwise specified, these are not independent of each other, but are respective portions of a single example, or are in a relation such that one is details of a part, a modified example, or the like of a part or the whole of the other. Further, in principle, description on the similar portions is not repeated. Furthermore, respective structural elements in embodiments are not essential, unless otherwise specified, and except when they are theoretically limited to the numbers, and unless otherwise apparent from the context.

Further, the term "semiconductor device" used in the present invention embraces the one obtained by mounting a semiconductor chip and the like over a base material (such as a lead frame, a metal sheet, a metal substrate, an insulation film, a resin substrate, or a ceramic substrate), or the one obtained by integrally supporting a semiconductor chip and the like by a holding member (such as a sealing resin body, a ceramic housing, a resin housing, or a metal housing). Incidentally, the term "semiconductor device" used in the present invention embraces a WLP (Wafer Level Package), a SIP (System In Package), a multi-chip module, or the like. The term "semiconductor chip" herein used embraces various transistors (active elements) alone, or the one obtained by integrating resistors, capacitors, and the like around them as the center over a semiconductor chip or the like (for example, single crystal silicon substrate) (including a module in which a plurality of semiconductor chips and the like are integrated in a package, and the like). Further, representative examples of the various transistors mainly in the silicon type semiconductor chips may include MISFETs (Metal Insulator Semiconductor Field Effect Transistors) typified by MOSFETs (Metal Oxide Semiconductor Field Effect Transistors). Then, representative examples of the integrated circuit configuration may include a CMIS (Complementary Metal Insulator Semiconductor) type integrated circuit typified by a CMOS (Complementary Metal Oxide Semiconductor) type integrated circuit of a combination of an N channel type MISFET and a P channel type MISFET.

Further, representative examples of various transistors mainly in compound type semiconductor chips include MESFET (Metal-Semiconductor Field Effect Transistor) and HEMT (High Electron Mobility Transistor).

2. Similarly, in the description of embodiments, and the like, even the term "X including A" for the material, composition, or the like does not exclude the one including an element other than A as one of the main structural elements unless otherwise specified and unless otherwise apparent from the context. For example, for the component, the term is used to embrace "X including A as a main component", and the like. For example, it is naturally understood that even the term "silicon member" or the like herein used is not limited to pure silicon but also embraces a SiGe alloy, other multinary alloys containing silicon as a main component, and other members containing additives.

3. Similarly, although preferred examples are shown with respect to configuration, position, attribute, and the like, it is naturally understood that the present invention is not strictly limited thereto unless otherwise specified and unless otherwise apparent from the context.

4. Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

5. The term "wafer" herein used generally refers to a single crystal silicon wafer over which a semiconductor device (which may be a semiconductor integrated circuit device or an electronic device) is to be formed. However, it is naturally understood that the term also embraces a composite wafer of insulation substrate such as an epitaxial wafer, a SOI substrate, or a LCD glass substrate, and a semiconductor layer or the like.

Further, the term "semiconductor chip", "integrated circuit chip", "chip", or the like embraces a single element, or an integrated circuit formed on a semiconductor substrate or an insulation substrate. The "semiconductor chips" currently used for various purposes are classified into "silicon type semiconductor chips" and "compound type semiconductor chips". Typical examples of the semiconductor corresponding to the "compound type semiconductor chip" include GaAs, GaN, AlGaAs, SiC, InSb, and InP (including composite substrates thereof). On the other hand, typical examples of the semiconductor corresponding to the silicon type semiconductor chip include those formed over a single crystal silicon substrate, an epitaxial silicon substrate, or the like. Incidentally, in the present invention, SiGe type devices (which are strictly compound semiconductors) are often integrated over a silicon substrate, and hence, for convenience, including single SiGe type devices and those integrated over a silicon type semiconductor substrate, are classified into "silicon type".

Further, the compound type semiconductor chips exemplified in embodiments of the present invention are high frequency antenna switches for use in, for example, cellular phones. The silicon type semiconductor chip is, for example, a control chip thereof (a chip having a control function of the high frequency antenna switch).

6. Further, for a chip, a package, a lead, or an external terminal, or a portion thereof, when the term "top surface" or "front surface", or "bottom surface" or "back surface" is used in the present invention, unless otherwise specified, the surface on the chip-bearing side of the lead frame is referred to as a "top surface" or "front surface" irrespective of the direction of space, and the surface on the opposite side is referred to as a "bottom surface" or "back surface".

Incidentally, wire bonding is generally carried out by a thermosonic system in which heating, bonding pressurization, and ultrasonic vibration are applied roughly simultaneously using a bonding tool such as a capillary. In the present invention, when bonding is carried out between a chip and a lead, the bonding system in which the first bonding point (starting point) is set over the bonding pad of the chip, and the second bonding point (end point) is set over an external terminal (lead) is referred to as "forward bonding", and the converse is referred to as "reverse bonding".

Incidentally, in bonding, generally, at the first bonding point, ball bonding is performed, and the wire direction immediately over the ball is roughly the vertical direction (i.e., the angle formed between the wire and the horizontal plane is close to 90 degrees). On the other hand, at the second bonding point, wedge bonding is performed, and the wire direction is an angle close to the horizontal plane, or has a relatively shallow slope (i.e., the angle formed between the wire and the horizontal plane is smaller than 90 degrees).

Incidentally, in embodiments described later, a description will be mainly given to the example in which a DAF (die attach film) is used as an adhesive layer to be interposed over the back surface of the chip. Herein, DAF is the adhesive layer already bonded before die bonding, and is generally bonded on a chip in a wafer state, and is divided into individual chips together with the wafer during dicing. Incidentally, it is naturally understood that die bonding not using DAF is also possible. However, use of the DAF has an advantage of facilitating the step, and other advantages.

7. The term "dicing" means division of the wafer into individual chips. The "dicing" may be referred to as "pelletizing". The term "dicing" used in the present invention embraces not only the one by a blade, but also the one by a laser (including a heat cutting system, and the process in which a modified layer is formed by two-photon absorption).

8. The term "MAP (mold array process) system" denotes the following system: a semiconductor chip (single or plural) is fixed to each of a large number of unit device regions over the main surface of a wiring substrate or a metal sheet, and the large number of unit device regions are sealed by a resin in one step; then, the resulting substrate or sheet is diced into individual unit device regions (semiconductor elements). The wiring substrates herein used include printed circuit substrates such as glass/epoxy wiring substrates and flexible wiring substrates, a tape back-up lead frame in which a lead frame is bonded over a polyimide adhesive tape, etc., and the like. When a printed circuit substrate is used as a wiring substrate, division is performed together with the wiring substrate. In the case of the tape back-up lead frame, after sealing, the tape is released, and the adhesive is removed; then, necessary lead plating or the like is performed, followed by division. Also in the case of a metal sheet, after sealing, the metal sheet is released, followed by division.

9. An "electroforming package" is a package manufactured in the following manner: lead electrodes, tab electrodes (island parts or die pad parts), and the like are formed over a metal sheet by electroforming (a kind of electroplating); and after chip bonding, wire bonding, resin sealing, and the like, device portions (single or a plurality of unit device regions) and a metal sheet are separated. In the following embodiment, a description will be mainly given to the electroforming package of the MAP system using a metal sheet. One advantage of the electroforming package resides in that the height can be earned just as much as the height of the wiring substrate or the like not being used. The electroforming package system forms a lead (an external terminal) by electroplating, and hence is also referred to as PLP (plating lead package) system.

With the "MAP system electroforming package process", first, lead electrodes and the like are formed over a metal sheet by electroforming, and die bonding, wire bonding, resin sealing, and the like are performed. This results in manufacturing of a "metal sheet resin sealing body composite" (intermediate product) including a "resin sealing body" and a metal sheet. Herein, the resin sealing body is a structure in which semiconductor chips, bonding wires, lead electrodes, and the like are sealed with a resin. Then, the metal sheet is released from the metal sheet resin sealing body composite, resulting in a separated resin sealing body. Herein, the "metal sheets" are generally roughly solid metal sheets (including those subjected to a necessary surface treatment). The main surface on the opposite side to the plating surface may be subjected to a reinforcing treatment such as bonding of an organic resin tape (including coating).

One advantage of the MAP system electroforming package process resides in that dicing is easy (the resin and the metal are not required to be simultaneously cut) because the leads and the like are not integrally formed with the tie bars. An adhesive tape is not used as with the tape back-up lead frame system. For this reason, the adhesive contamination after releasing is not required to be removed. Further, the substrate (metal sheet) which is the bottom surface for the sealing treatment is not a resin having a small rigidity but a metal sheet having a large rigidity. This provides the following advantages: the resin burr is less likely to be caused; further, the effect of the ultrasonic wave in wire bonding is not impaired; and the like. Further, it is also possible to avoid the reduction of the flatness of the package bottom surface due to flexure of the resin sheet, and the like.

Details of Embodiments

Below, embodiments will be further described in details. In respective drawings, the same or similar portions are indicated with the same or similar reference signs or reference numerals, and a description thereon will not be repeated in principle.

Further, in the accompanying drawings, hatching or the like may be omitted even in cross section when it rather complicates the drawing, or when it is apparently distinct from the gap. In conjunction with this, when apparent from the description or the like, or in other cases, even for a two-dimensionally closed hole, the background outline may be omitted. Further, even not in cross section, hatching may be added in order to clearly demonstrate that the part is not a gap.

FIG. 1 is a cross-sectional view showing a semiconductor device 1 of one embodiment. The semiconductor device 1 includes a plurality of external terminals 2, a lower semiconductor chip (first semiconductor chip) 3, and an upper semiconductor chip (second semiconductor chip) 4. The external terminal 2 is a conductor for receiving a signal from the outside of the semiconductor device 1, or outputting a signal to the outside. At each of the lower semiconductor chip 3 and the upper semiconductor chip 4, at least one circuit element is integrated. The semiconductor device 1 of the present embodiment has a structure in which the lower semiconductor chip 3 and the upper semiconductor chip 4 are stacked in the vertical direction. The term "vertical direction" herein used means the direction perpendicular to the front side main surface 3a of the lower semiconductor chip 3, and the front side main surface 4a of the upper semiconductor chip 4.

Over the front side main surface 3a of the lower semiconductor chip 3, there are disposed bonding pads 6. Each bonding pad 6 is coupled to its corresponding external terminal 2 by a bonding wire 11. Similarly, over the front side main surface 4a of the upper semiconductor chip 4, there are disposed bonding pads 8. Each bonding pad 8 is coupled to its corresponding external terminal 2 by a bonding wire 12.

To the back side main surface 3b of the lower semiconductor chip 3, there is bonded an adhesive layer 5. The adhesive layer 5 is formed by, for example, curing of a die attach film. As one example, the adhesive layer 5 has a thickness of 25 μm which is a standard thickness.

Further, the front side main surface 3a of the lower semiconductor chip 3 and the back side main surface 4b of the upper semiconductor chip 4 are bonded to each other by an adhesive layer 7. The adhesive layer 7 is also formed by, for example, curing of a die attach film. The adhesive layer 7 is formed in such a manner as to embed therein the bonding pad 6, and a portion of the bonding wire 11 in the vicinity of the bonding pad 6.

Figure 2:
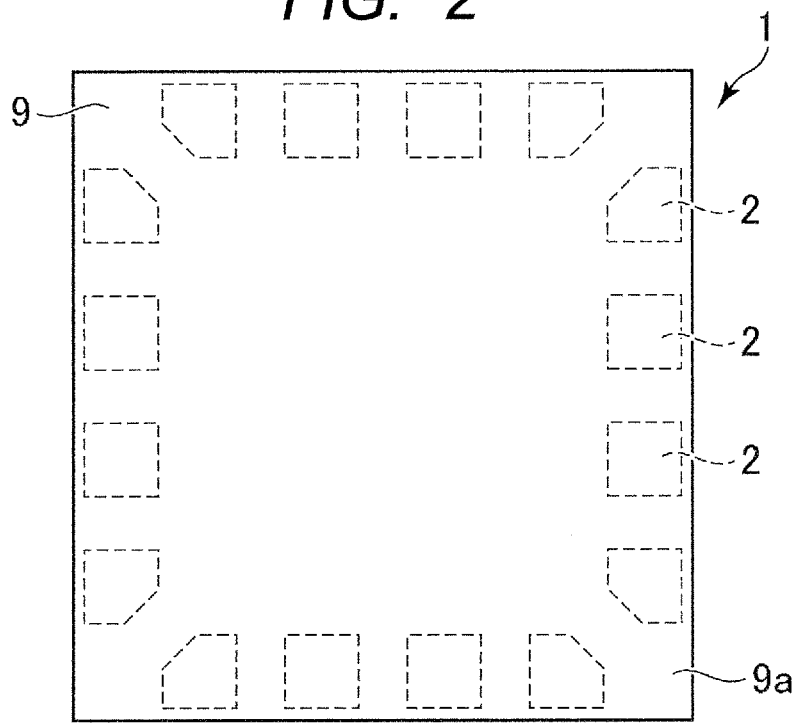
FIG. 2 is a top view showing the structure of the semiconductor device of FIG. 1.
Figure 3:
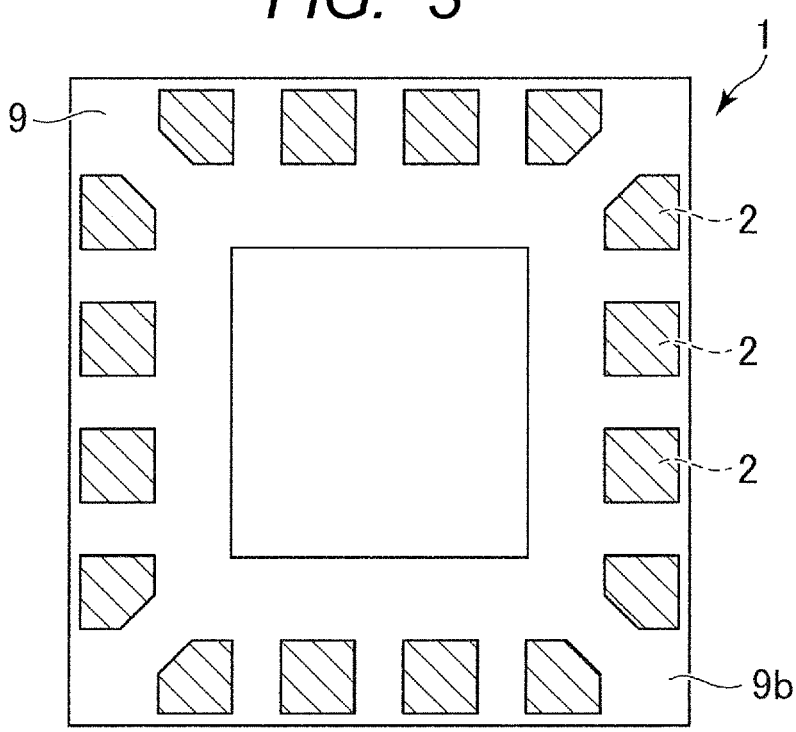
FIG. 3 is a bottom view showing the structure of the semiconductor device of FIG. 1.

The external terminal 2, the lower semiconductor chip 3, the upper semiconductor chip 4, and the bonding wires 11 and 12 are sealed by a resin sealing body 9. Herein, as shown in FIG. 2, nothing is exposed at the front surface 9a of the resin sealing body 9. On the other hand, as shown in FIG. 3, the external terminals 2 and the adhesive layer 5 are exposed at the back surface 9b of the resin sealing body 9. The adhesive layer 5 is situated at the central part of the back surface 9b of the resin sealing body 9, and the external terminals 2 are disposed in such a manner as to surround the adhesive layer 5. In the present embodiment, there is adopted a structure in which the adhesive layer 5 is exposed, namely, a structure not using a die pad. In order to eliminate the necessity of the die pad, the same color as that of the resin sealing body 9, specifically, black is preferably adopted as the color of the adhesive layer 5.

In order to keep horizontal the front side main surface 4a of the upper semiconductor chip 4, and to smoothly perform wire bonding of each bonding wire 12 to the bonding pad 8 of the upper semiconductor chip 4, in the present embodiment, the adhesive layer 7 is formed thicker than the adhesive layer 5.

The lower limit of the preferable range of the thickness of the adhesive layer 7 is determined from the diameter d1 of the bonding wire 11, and the size of the stud bump formed at one end of the bonding wire 11 to be bonded to the bonding pad 6, and is about 40 μm. On the other hand, the upper limit of the preferable range of the thickness of the adhesive layer 7 is determined by the life of the blade in dicing, and the like, and is about 100 μm.

With the configuration of the semiconductor device 1 shown in FIG. 1, it should be noted that the distance in the vertical direction between the front side main surface 4a of the upper semiconductor chip 4 and the external terminal 2 is larger than the distance in the vertical direction between the front side main surface 3a of the lower semiconductor chip 3 and the external terminal 2. This means that, as the whole of the semiconductor device 1, the length of the bonding wire 12 is larger than the length of the bonding wire 11.

The inductance of the bonding wire is schematically proportional to the length of the bonding wire. For this reason, the structure in which the bonding wire 12 is longer than the bonding wire 11 may cause a difference in inductance between the bonding wires 11 and 12. The difference in inductance between the bonding wires 11 and 12 may become a problem in circuit design.

In order to cope with such a problem, in the present embodiment, there is adopted a configuration in which the diameter d2 of the bonding wire 12 coupled to the upper semiconductor chip 4 is larger than the diameter d1 of the bonding wire 11 coupled to the lower semiconductor chip 3. The configuration effectively reduces the difference between the inductance of the bonding wire 12 coupled to the upper semiconductor chip 4 and the inductance of the bonding wire 11 coupled to the lower semiconductor chip 3. As for the utility of the configuration in which the diameter d2 of the bonding wire 12 is larger than the diameter d1 of the bonding wire 11 will be described in details later.

Figure 4A:
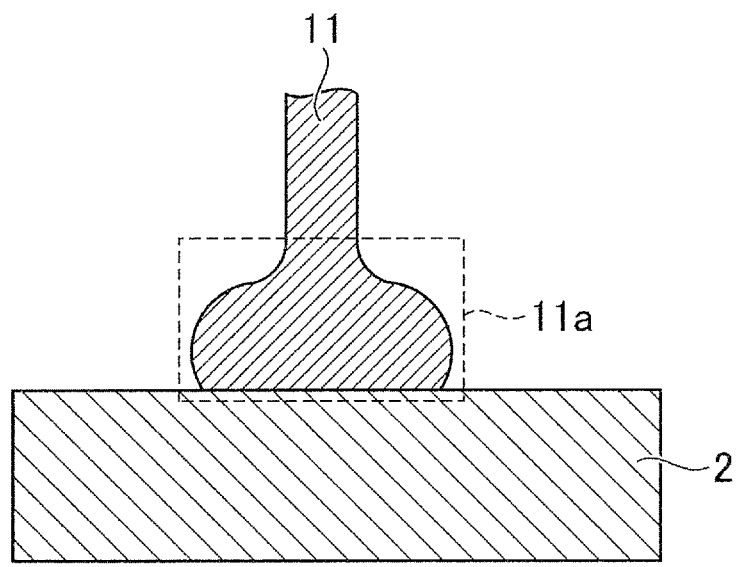
FIG. 4A is a cross-sectional view showing the structure of a coupling part between a bonding wire coupled to a lower semiconductor chip and an external terminal.
Figure 4B:
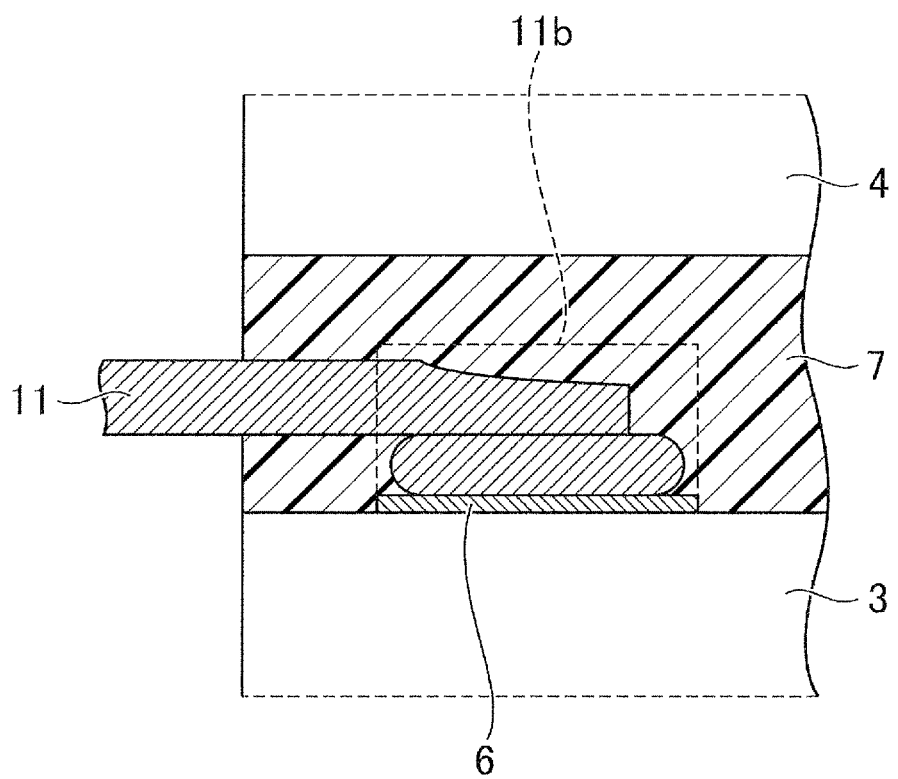
FIG. 4B is a cross-sectional view showing the structure of a coupling part between a bonding pad of the lower semiconductor chip and the bonding wire.
Figure 5A:
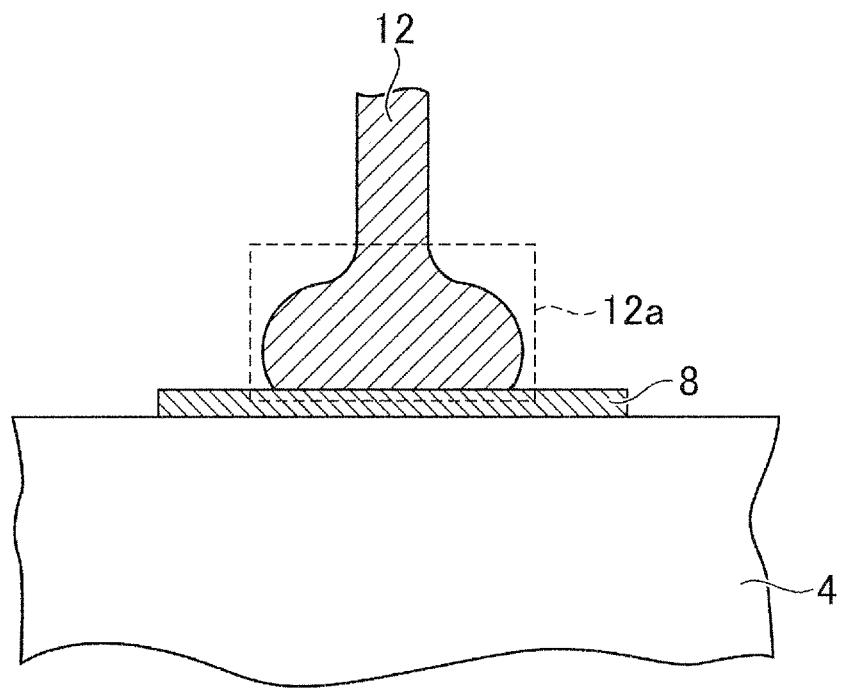
FIG. 5A is a cross-sectional view showing the structure of a coupling part between a bonding pad of an upper semiconductor chip and a bonding wire.

Further, in the present embodiment, while reverse bonding is adopted in wire bonding between each bonding pad 6 of the lower semiconductor chip 3 and each external terminal 2, forward bonding is adopted in wire bonding between each bonding pad 8 of the upper semiconductor chip 4 and each external terminal 2. Particularly, for the lower semiconductor chip 3, as shown in FIG. 4A, ball bonding is performed at the coupling part 11a of the bonding wire 11 and the external terminal 2. Then, as shown in FIG. 4B, wedge bonding is performed at the coupling part 11b of the bonding wire 11 and the bonding pad 6 of the lower semiconductor chip 3. On the other hand, for the upper semiconductor chip 4, as shown in FIG. 5A, ball bonding is performed at the coupling part 12a of the bonding wire 12 and the bonding pad 8 of the upper semiconductor chip 4. Then, wedge bonding is performed at the coupling part 12b of the bonding wire 12 and the bonding pad 8 of the upper semiconductor chip 4.

Such a structure is effective for facilitating the optimization of the loop heights of the bonding wires 11 and 12, and reducing the difference in inductance between the bonding wires 11 and 12. The reduction of the difference in inductance between the bonding wires 11 and 12 due to the optimization of the loop heights of the bonding wires 11 and 12 will also be described in details later.

As the lower semiconductor chip 3 and the upper semiconductor chip 4, various semiconductor chips may be adopted. As one example thereof, as the lower semiconductor chip 3 and the upper semiconductor chip 4, GaAs type compound semiconductor chips may be used. In this case, the dimensions of the lower semiconductor chip 3 and the upper semiconductor chip 4 are, for example, about 0.8 millimeters square, and 0.1 millimeter in thickness.

Figure 6:
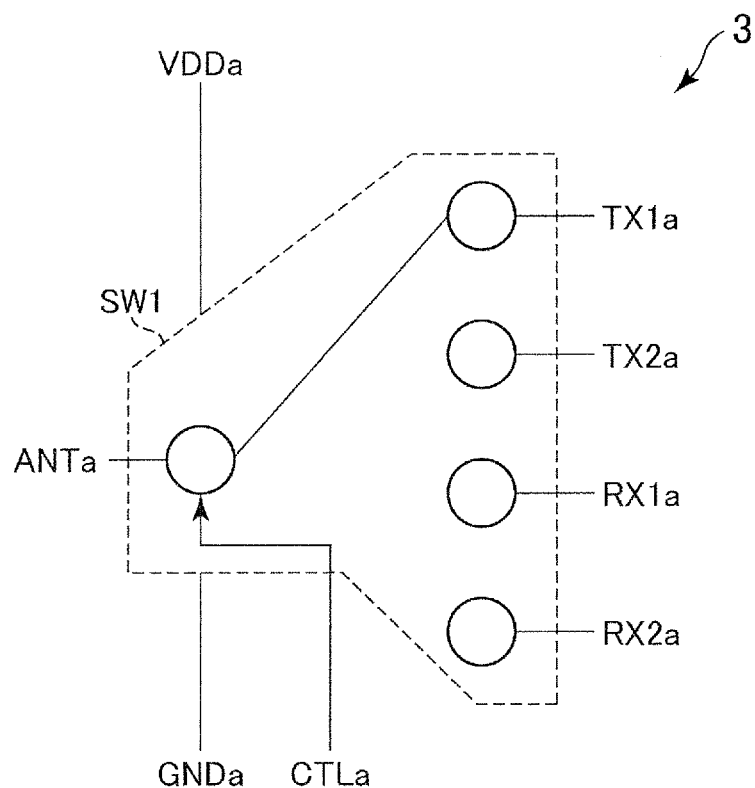
FIG. 6 is a view showing a circuit integrated on the lower semiconductor chip.
Figure 7:
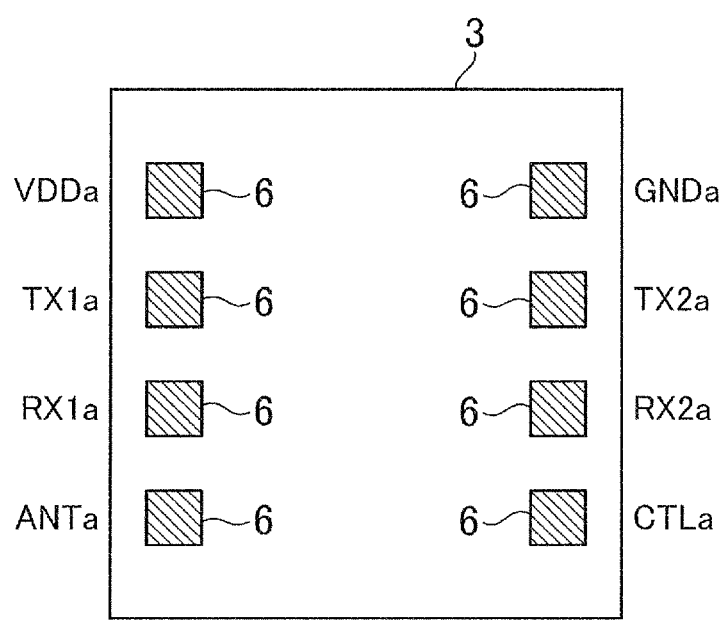
FIG. 7 is a view showing the pad arrangement of the lower semiconductor chip.
Figure 8:
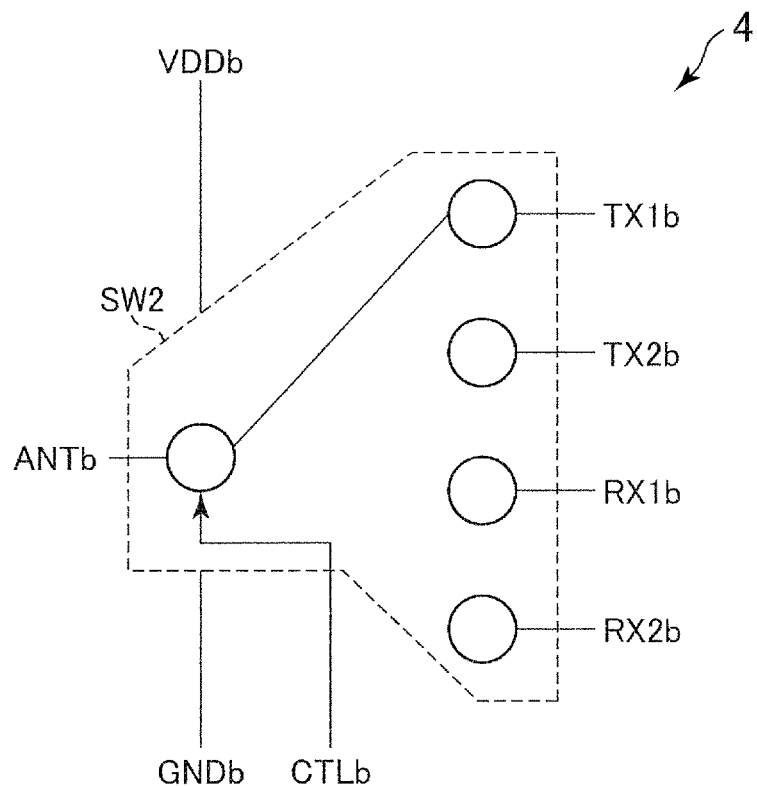
FIG. 8 is a view showing a circuit integrated on the upper semiconductor chip.
Figure 9:
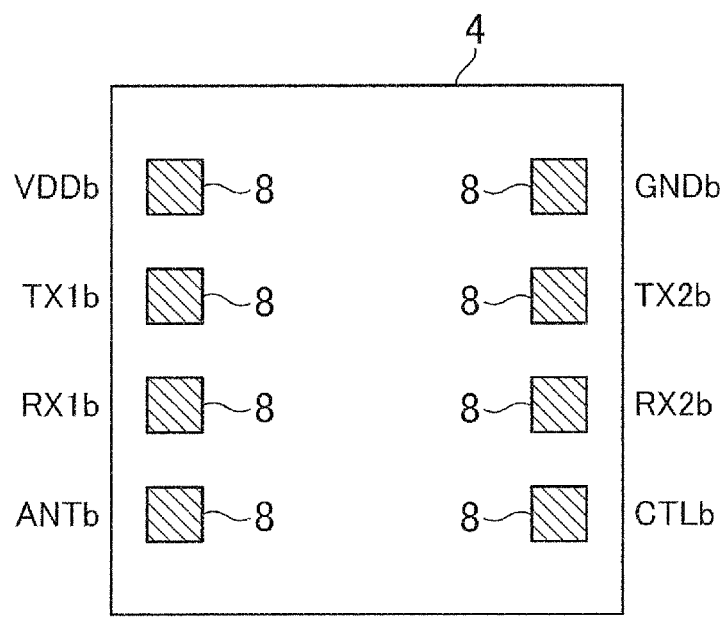
FIG. 9 is a view showing the pad arrangement of the upper semiconductor chip.

Below, the examples of the lower semiconductor chip 3 and the upper semiconductor chip 4 will be described in more details. FIGS. 6 to 9 are each a view showing an example of the configuration of the lower semiconductor chip 3 and the upper semiconductor chip 4. Particularly, FIG. 6 is a circuit diagram showing the configuration of a circuit integrated on the lower semiconductor chip 3, and FIG. 7 is a layout diagram showing the arrangement of the bonding pads 6 of the lower semiconductor chip 3. Whereas, FIG. 8 is a circuit diagram showing the configuration of a circuit integrated on the upper semiconductor chip 4, and FIG. 9 is a layout diagram showing the arrangement of the bonding pads 8 of the upper semiconductor chip 4.

As shown in FIG. 6, an antenna switch SW1 is integrated on the lower semiconductor chip 3. The antenna switch SW1 has the following eight terminals:

ANTa: antenna terminal,
TX1a, TX2a: transmitting terminal,
RX1a, RX2a: receiving terminal,
VDDa: power supply terminal,
GNDa: grounding terminal, and
CTLa: control terminal.

The antenna terminal ANTa is a terminal to be coupled to the antenna. The transmitting terminal TX1a and the transmitting terminal TX2a are each a terminal to be coupled to a transmission circuit (i.e., a circuit for outputting a signal to the antenna). The receiving terminals RX1a and RX2a are each a terminal to be coupled to the receiving circuit (i.e., a circuit for receiving a signal from the antenna). The power supply terminal VDDa and the grounding terminal GNDa are terminals for providing a power supply voltage and a circuit ground connection to the antenna switch SW1, respectively. The control terminal CTLa is a terminal for receiving a control signal from the antenna switch SW1.

The antenna switch SW1 has a function of coupling the antenna terminal ANTa to any of the transmitting terminals TX1a and TX2a, and the receiving terminals RX1a and RX2a in response to a control signal inputted to the control terminal CTLa. In other words, the antenna switch SW1 of the present embodiment has a function of selecting a channel to be actually used from the two channels for transmission and the two channels for reception.

As shown in FIG. 7, each of the eight terminals of the antenna switch SW1 of the lower semiconductor chip 3 is assigned to any of the bonding pads 6. In the example of FIG. 7, the four bonding pads 6 at the left-hand side column are used as the power supply terminal VDDa, the transmitting terminal TX1a, the receiving terminal RX1a, and the antenna terminal ANTa, respectively. On the other hand, the four bonding pads 6 at the right-hand side column are used as the grounding terminal GNDa, the transmitting terminal TX2a, the receiving terminal RX2a, and the control terminal CTLa, respectively.

Herein, the antenna terminal ANTa, the transmitting terminals TX1a and TX2a, and the receiving terminals RX1a and RX2a of the eight terminals of the antenna switch SW1 are terminals for handling high frequency signals to be inputted to and outputted from the antenna. For example, when a DCS (Digital Cellular System) and PCN (Personal Communication Services) are used as a mobile communication protocol, signals within a frequency band of roughly 800 MHz to 1 GHz, and within a frequency band of 1.7 GHz to 2.2 GHz are inputted to and outputted from the antenna. On the other hand, when as the mobile communication protocol, GSM (Global System for Mobile Communication) is used, signals within the frequency band of roughly 800 MHz to 1 GHz is inputted to and outputted from the antenna. The antenna terminal ANTa, the transmitting terminals TX1a and TX2a, and the receiving terminals RX1a and RX2a are terminals for handing signals within the frequency bands (more specifically, signals within the frequency band of 800 MHz to 2.2 GHz). Accordingly, the terminals may be collectively referred to as "high frequency signal terminals". On the other hand, the control terminal CTLa, the power supply terminal VDDa, and the grounding terminal GNDa are terminals not handling high frequency signals.

On the other hand, as shown in FIG. 8, on the upper semiconductor chip 4, an antenna switch SW2 is integrated. The antenna switch SW2 has the same function as that of the antenna switch SW1 of the lower semiconductor chip 3, and has the following eight terminals:

ANTb: antenna terminal,
TX1b, TX2b: transmitting terminal,
RX1b, RX2b: receiving terminal,
VDDb: power supply terminal,
GNDb: grounding terminal, and
CTLb: control terminal for receiving a control signal from the antenna switch SW2.

The antenna switch SW2 has a function of coupling the antenna terminal ANTb to any of the transmitting terminals TX1b and TX2b, and the receiving terminals RX1b and RX2b in response to a control signal to be inputted to the control terminal CTLb. In other words, the antenna switch SW2 also has a function of selecting a channel to be actually used from the two channels for transmission and the two channels for reception as with the antenna switch SW1.

As shown in FIG. 9, each of the eight terminals of the antenna switch SW2 are assigned to any of the bonding pads 8. In the example of FIG. 9, the four bonding pads 8 on the left-hand side column are used as the power supply terminal VDDb, the transmitting terminal TX1b, the receiving terminal RX1b, and the antenna terminal ANTb, respectively. On the other hand, the four bonding pads 8 on the right-hand side column are used as the grounding terminal GNDb, the transmitting terminal TX2b, the receiving terminal RX2b, and the control terminal CTLb, respectively.

In the present embodiment, it should be noted that the lower semiconductor chip 3 and the upper semiconductor chip 4 are the same chips (i.e., the semiconductor chips formed by the same process using the same mask set). In the lower semiconductor chip 3 and the upper semiconductor chip 4, there are integrated circuits having the same function, having the same circuit layout, and having the same pad arrangement. The problem of the difference in inductance between the bonding wires 11 and 12 appears most remarkably in such a case. When the lower semiconductor chip 3 and the upper semiconductor chip 4 are expected to perform the same operation by using the same chips therefor, the difference in inductance between the bonding wires 11 and 12 may appear as the difference in operation characteristics between the lower semiconductor chip 3 and the upper semiconductor chip 4 in the semiconductor device 1. Such a difference in operation characteristics may be desirably eliminated. In the present embodiment, as described later, there is adopted a configuration in which the diameter d2 of the bonding wire 12 to be coupled to the upper semiconductor chip 4 is larger than the diameter d1 of the bonding wire 11 to be coupled to the lower semiconductor chip 3. This reduces the difference in inductance between the bonding wires 11 and 12.

Figure 10:
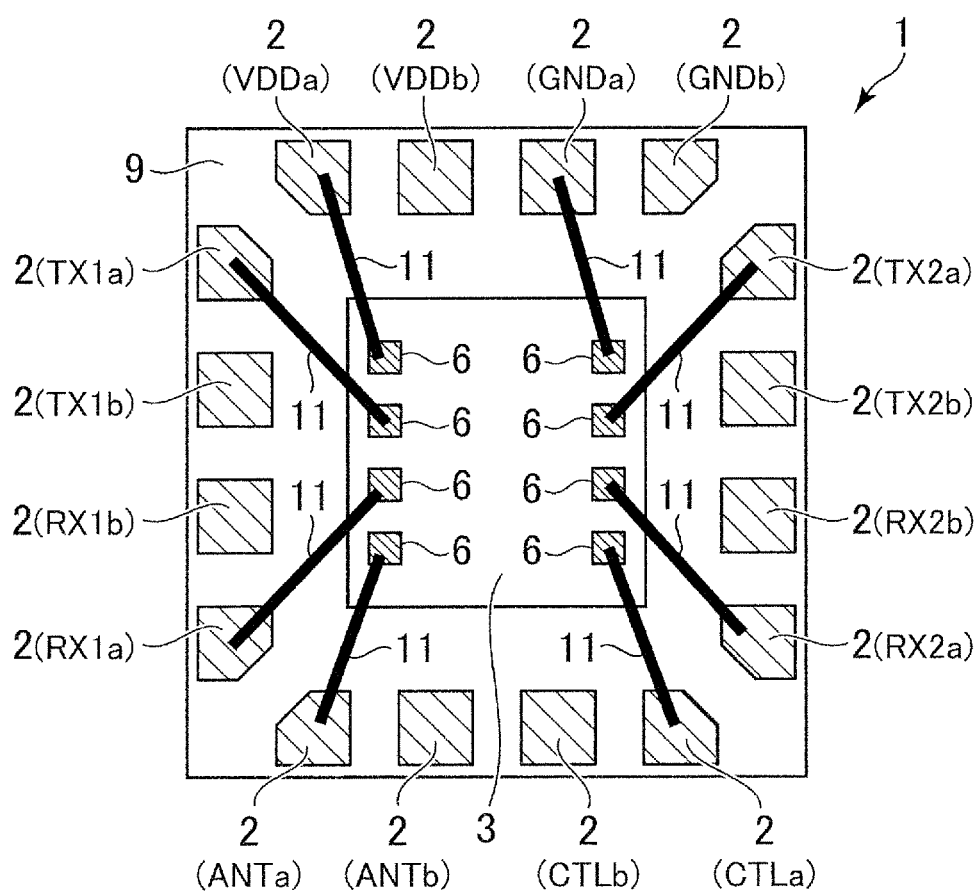
FIG. 10 is a plan view showing the wiring of bonding wires for coupling the bonding pads of the lower semiconductor chip and external terminals, respectively (shown with the upper semiconductor chip removed therefrom)
Figure 11:
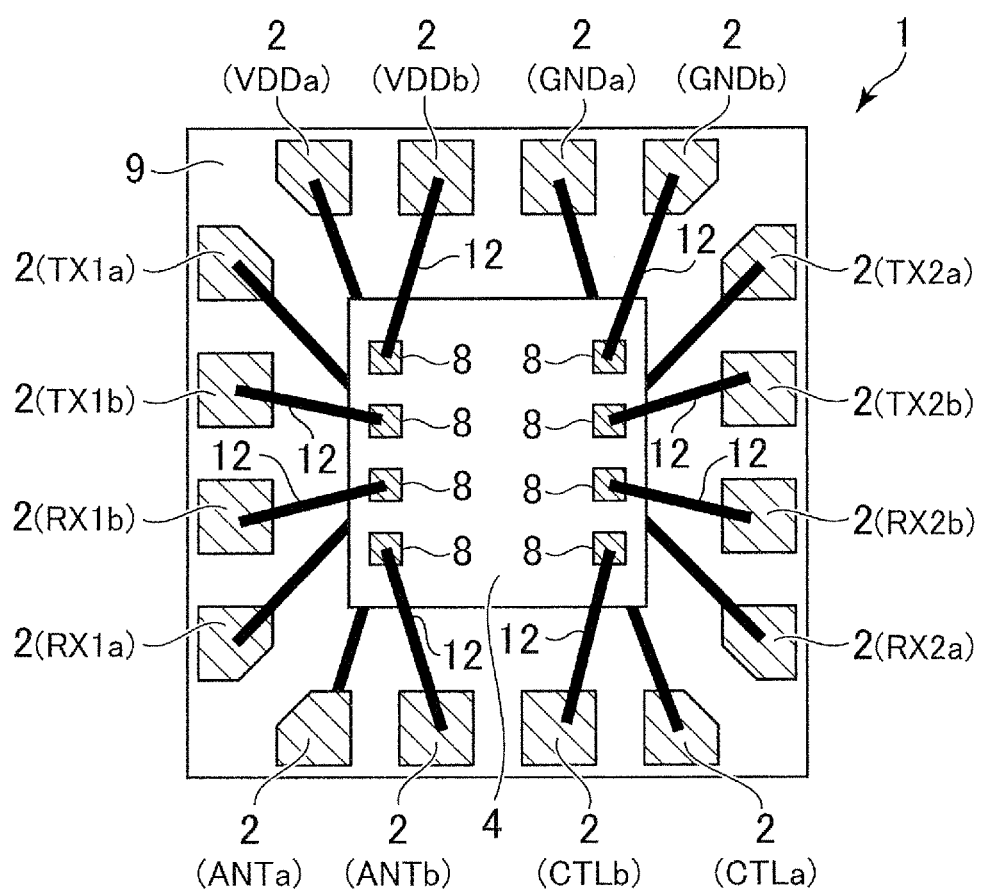
FIG. 11 is a plan view showing the wiring of bonding wires between the bonding pads of the upper semiconductor chip and external terminals.

FIGS. 10 and 11 are each a wiring diagram showing an example of wiring of the bonding wire 11 to be coupled to the lower semiconductor chip 3, and the bonding wire 12 to be coupled to the upper semiconductor chip 4. As shown in FIG. 10, in the semiconductor device 1, there are provided external terminals 2 to be coupled to the eight terminals of the antenna switch SW1 of the lower semiconductor chip 3, and the eight terminals of the antenna switch SW2 of the upper semiconductor chip 4. In each example of FIGS. 10 and 11, the external terminals 2 to be coupled to the power supply terminals VDDa and VDDb, and the grounding terminals GNDa and GNDb are arranged side by side along the top side of the lower semiconductor chip 3, and the external terminals 2 to be coupled to the transmitting terminals TX1a and TX1b, and the receiving terminals RX1a and RX1b are arranged side by side along the left side thereof. Further, the antenna terminals ANTa and ANTb, and the control terminals CTLa and CTLb are arranged side by side along the bottom side of the lower semiconductor chip 3; and the external terminals 2 to be coupled to the transmitting terminals TX2a and TX2b, and the receiving terminals RX2a and RX2b are arranged side by side along the right side thereof. Incidentally, the terms "top side", "bottom side", "right side", and "left side" merely shows the positions in FIGS. 10 and 11, and are not related to top, bottom, left, and right in the actual space.

Each bonding pad 6 of the lower semiconductor chip 3 is electrically coupled to its corresponding external terminal 2 by the bonding wire 11. For example, the bonding pad 6 of the lower semiconductor chip 3 corresponding to the power supply terminal VDDa is coupled to the external terminal 2 corresponding to the power supply terminal VDDa by the bonding wire 11. The same also applies to other bonding pads 6 of the lower semiconductor chip 3. Similarly, each bonding pad 8 of the upper semiconductor chip 4 is electrically coupled to its corresponding external terminal 2 by the bonding wire 12. For example, the bonding pad 8 of the upper semiconductor chip 4 corresponding to the power supply terminal VDDb is coupled to the external terminal 2 corresponding to the power supply terminal VDDb by the bonding wire 12.

The semiconductor device 1 of the present embodiment described up to this point has a configuration adopting various countermeasures for reducing the difference in inductance between the bonding wire 11 to be coupled to the lower semiconductor chip 3 and the bonding wire 12 to be coupled to the upper semiconductor chip 4.

First, in the semiconductor device 1, the diameter $d_2$ of the bonding wire 12 to be coupled to the upper semiconductor chip 4 is larger than the diameter $d_1$ of the bonding wire 11 to be coupled to the lower semiconductor chip 3. The inductance of the bonding wire decreases with an increase in diameter thereof. Accordingly, by making larger the diameter $d_2$ of the bonding wire 12, which tends to become longer, to be coupled to the upper semiconductor chip 4 than the diameter $d_1$ of the bonding wire 11 to be coupled to the lower semiconductor chip 3, it is possible to reduce the difference in inductance between the bonding wires 11 and 12.

Incidentally, for other terminals than high frequency signal terminals, in most cases, the difference in inductance does not matter. Accordingly, the diameter of each bonding wire 12 to be coupled to other bonding pads 8 than the bonding pads 8 used as the high frequency signal terminals (i.e., the bonding pads 8 used as the antenna terminal ANTb, the transmitting terminals TX1b and TX2b, and the receiving terminals RX1b and RX2b) may be equal to the diameter of the bonding wire 11 to be coupled to the lower semiconductor chip 3. However, from the viewpoint of simplifying the bonding step, the diameters of all the bonding wires 12 to be coupled to the upper semiconductor chip 4 are preferably set larger than the diameter of the bonding wire 11 to be coupled to the lower semiconductor chip 3.

Figure 12:
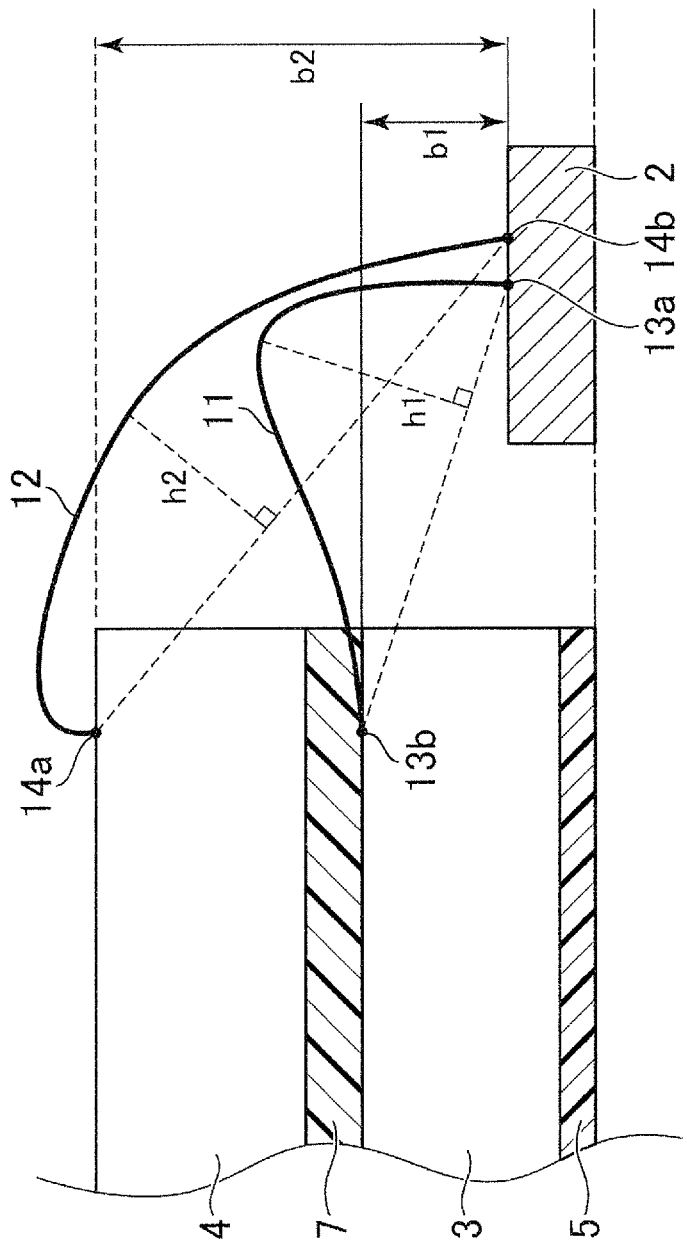
FIG. 12 is a side view showing the loop height of each bonding wire.

Secondly, the loop height $h_1$ of the bonding wire 11 to be coupled to the lower semiconductor chip 3, and the loop height $h_2$ of the bonding wire 12 to be coupled to the upper semiconductor chip 4 are adjusted so as to reduce the difference in inductance. Herein, as shown in FIG. 12, the loop height of the bonding wire is the value defined using the line segment connecting the start point and the end point of the bonding wire, and is the length of the foot of the perpendicular drawn from the position on the bonding wire most distant from the line segment to the line segment. In FIG. 12, the start point and the end point of the bonding wire 11 to be coupled to the lower semiconductor chip 3 are represented by a reference sign 13a and a reference sign 13b, respectively. Herein, it should be noted that the bonding wire 11 to be coupled to the lower semiconductor chip 3 is subjected to reverse bonding. On the other hand, the start point and the end point of the bonding wire 12 to be coupled to the upper semiconductor chip 4 are represented by a reference sign 14a and a reference sign 14b, respectively. Herein, it should be noted that, the bonding wire 11 to be coupled to the lower semiconductor chip 3 is bonded with reverse bonding, and the bonding wire 12 to be coupled to the upper semiconductor chip 4 is bonded with forward bonding.

The inductance of the bonding wire increases with an increase in loop height. Accordingly, by setting the loop height of the bonding wire 11 to be coupled to the lower semiconductor chip 3 higher than the loop height $h_2$ of the upper semiconductor chip 4, it is possible to reduce the difference in inductance between the bonding wires 11 and 12.

Below, the effects of the adjustment of the diameters $d_1$ and $d_2$, and the loop heights $h_1$ and $h_2$ of the bonding wires 11 and 12 described up to this point will be quantitatively described:

The reactance X of the bonding wire is represented by, $$X = 2\pi f L \qquad (1),$$

where f is the frequency of a signal to be transmitted through the bonding wire, and L is the inductance of the bonding wire. Whereas, the inductance L of the bonding wire can be approximated by, $$L = h \cdot l_B (1.4 \times 10^{-6} \ln(h \cdot l_B/d) - 7.6 \times 10^{-6}) \qquad (2),$$

where h is the loop height of the bonding wire (see FIG. 12), d is the diameter of the bonding wire, and $l_B$ is the wire length of the bonding wire.

With a signal frequency f within the range of GHz order, even when the inductance L is a small value of the nH order, the effect of the inductance L of the bonding wire exerted on the reactance X of the bonding wire is large.

Figure 13:
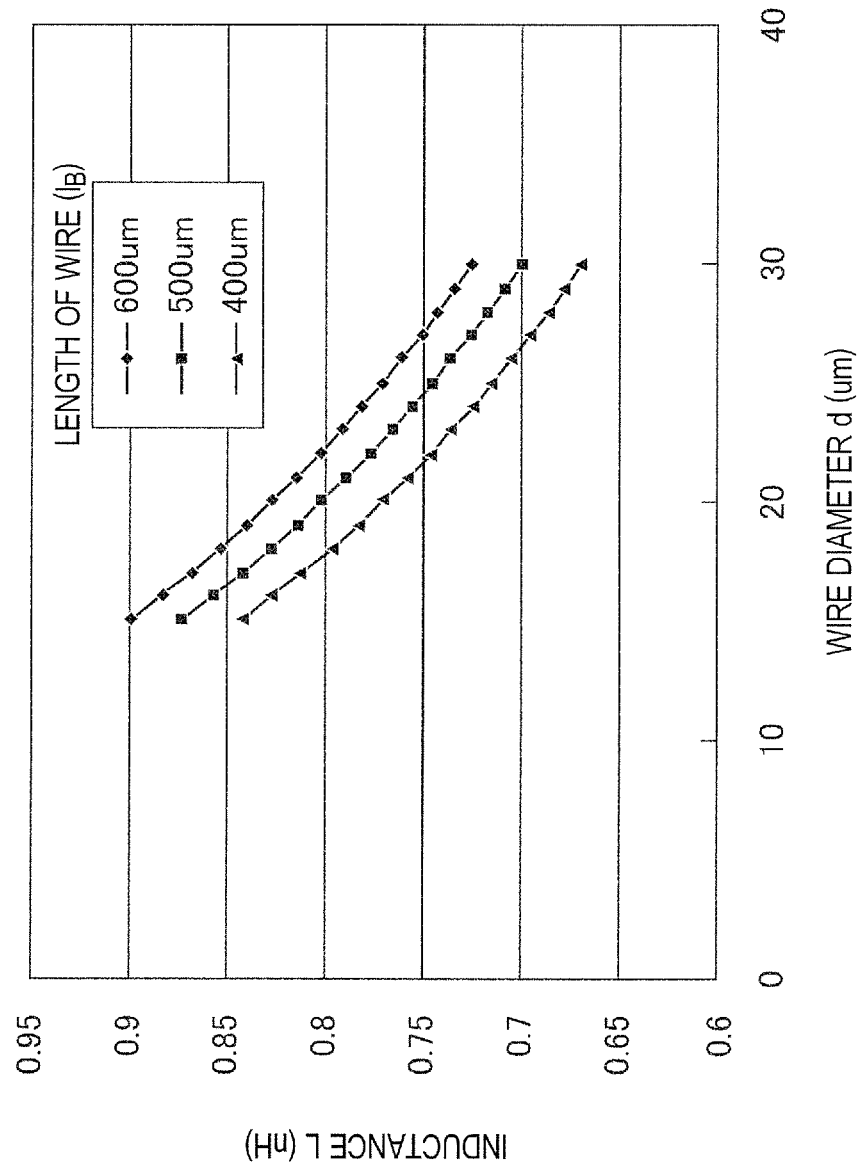
FIG. 13 is a graph showing the relationship between the wire diameter of the bonding wire and the inductance.

FIG. 13 is a graph showing the calculation results of the relation between the wire diameter d and the inductance L when the wire lengths $l_B$ are 400 μm, 500 μm, and 600 μm, respectively, calculated using the equation (2). Herein, for the calculation of FIG. 13, the loop height h is assumed to be 40 μm. The calculation results of FIG. 13 indicate as follows: when the difference in wire length $l_B$ is about 100 to 200 μm, adjustment of the wire diameter d can compensate for the difference in inductance L. For example, when the diameter $d_1$ of the bonding wire 11 is 20 μm, and the lengths of the bonding wires 11 and 12 are 400 μm and 600 μm, respectively, the inductances L can be made nearly equal by setting the diameter $d_2$ of the bonding wire 12 at about 25 μm.

Figure 14:
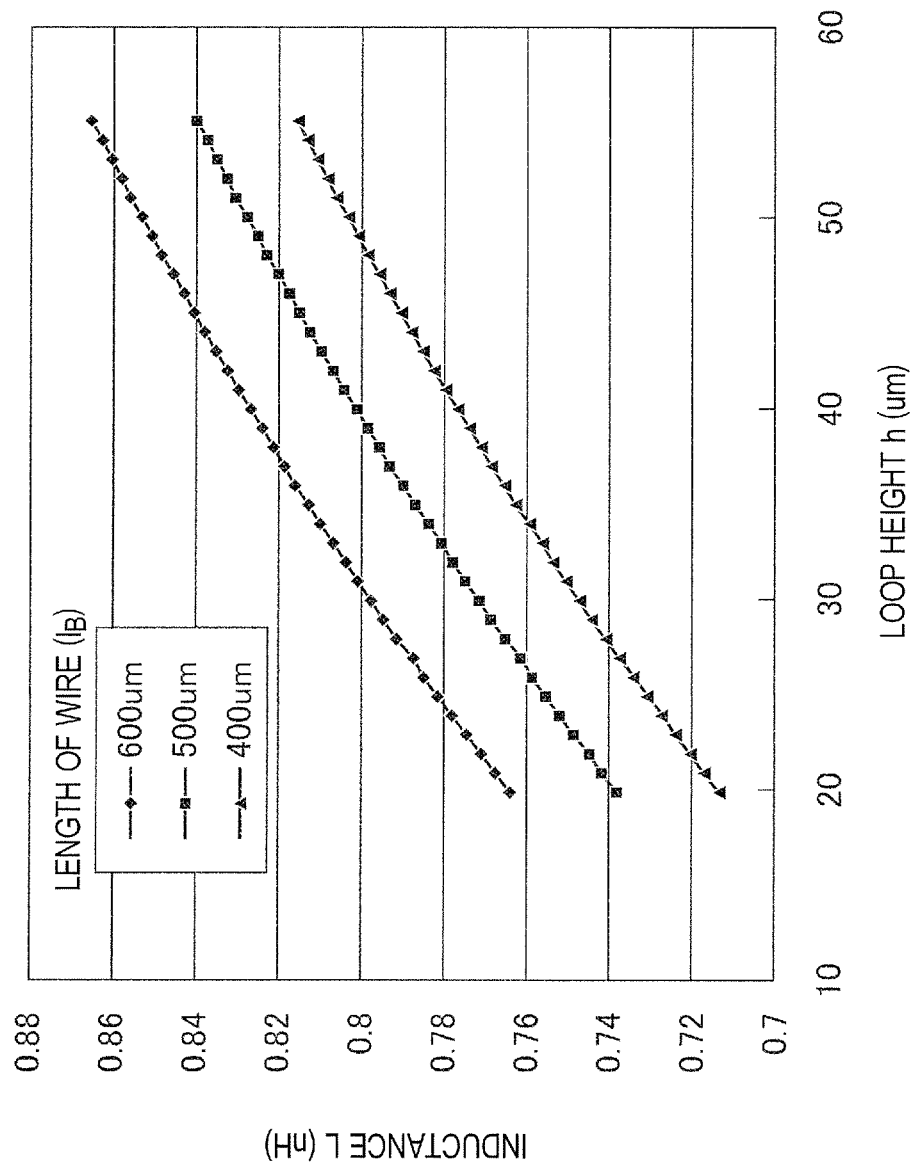
FIG. 14 is a graph showing the relationship between the loop height of each bonding wire and the inductance.

On the other hand, FIG. 14 is a graph showing the calculation results of the relation between the loop height h and the inductance L when the wire lengths $l_B$ are 400 μm, 500 μm, and 600 μm, respectively, calculated using the equation (2). Herein, for the calculation of FIG. 14, the wire diameter d is assumed to be 20 μm. The calculation results of FIG. 14 indicate as follows: when the difference in wire length $l_B$ is about 100 to 200 μm, adjustment of the loop height h can compensate for the difference in inductance L.

Herein, the bonding wire 12 to be coupled to the upper semiconductor chip 4 is subjected to forward bonding, and the bonding wire 11 to be coupled to the lower semiconductor chip 3 is subjected to reverse bonding. It should be noted that this configuration is advantageous for compensation for the difference in inductance L by the loop height. The bonding wire 12 to be coupled to the upper semiconductor chip 4 is desirably minimized in wire length. From such a viewpoint, the bonding wire 12 to be coupled to the upper semiconductor chip 4 is desirably bonded with forward bonding.

On the other hand, the bonding wire 11 to be coupled to the lower semiconductor chip 3 is subjected to reverse bonding. This is useful for facilitating the control of the loop height. As described above, the loop height $h_2$ of the bonding wire 12 to be coupled to the upper semiconductor chip 4 is set relatively lower; and the loop height of the bonding wire 11 to be coupled to the lower semiconductor chip 3 is set relatively higher. This can reduce the difference in inductance between the bonding wires 11 and 12. Herein, if the bonding wire 11 to be coupled to the lower semiconductor chip 3 is bonded with forward bonding, the restriction due to the distance between the bonding pad 6 and the upper semiconductor chip 4 complicates the control of the loop height. Particularly, when the bonding wire 11 is bonded by forward bonding, a capillary is moved upward from the bonding pad 6 to be subjected to ball bonding, thereby to ensure the loop height. However, the upper semiconductor chip 4 and the adhesive layer 7 are stacked over the lower semiconductor chip 3 after bonding of the bonding wire 11 (see a manufacturing method described later). For this reason, setting the loop height $h_1$ of the bonding wire 11 high requires such shape control of the bonding wire 11 as generally not being performed. Namely, there is caused a necessity of controlling the shape of the bonding wire 11 so as to positively increase the loop height in the vicinity of the end at which wedge bonding is performed. Such shape control is not impossible, but is not desirable.

Thirdly, in the present embodiment, the external terminal 2 to be coupled to the bonding pad 6 used as a specific high frequency signal terminal of the lower semiconductor chip 3, and the external terminal 2 to be coupled to the bonding pad 8 of the upper semiconductor chip 4 used as the high frequency signal terminal having the same function as that of the specific high frequency signal terminal are selected so as to reduce the difference in length between the bonding wires 11 and 12. More specifically, each bonding pad 6 used as the specific high frequency signal terminal of the lower semiconductor chip 3 is electrically coupled to the external terminal 2 which is not the external terminal 2 in the closest proximity to the bonding pad 6. On the other hand, each bonding pad 8 of the upper semiconductor chip 4 used as the high frequency signal terminal having the same function as that of the specific high frequency signal terminal is electrically coupled to the external terminal 2 in the closest proximity to the bonding pad 8. Herein, the bonding pads 6 used as the high frequency signal terminals are, as described above, the bonding pads 6 used as the antenna terminal ANTa, the transmitting terminals TX1*a* and TX2*a*, and the receiving terminals RX1*a* and RX2*a*. Similarly, the bonding pads 8 used as the high frequency signal terminals are the bonding pads 8 used as the antenna terminal ANTb, the transmitting terminals TX1*b* and TX2*b*, and the receiving terminals RX1*b* and RX2*b*.

For example, referring to FIG. 10, the bonding pad 6 used as the transmitting terminal TX2*a* of the lower semiconductor chip 3 is coupled not to the external terminal 2 in the closest proximity thereto (the external terminal 2 corresponding to the transmitting terminal TX2*b*), but to the external terminal 2 adjacent to the external terminal 2 in the closest proximity thereto. On the other hand, as shown in FIG. 11, the bonding pad 8 used as the transmitting terminal TX2*b* of the upper semiconductor chip 4 (this is the bonding pad 8 corresponding to the bonding pad 6 used as the transmitting terminal TX2*a* of the lower semiconductor chip 3) is coupled to the external terminal 2 in the closest proximity thereto.

With such a configuration, it is possible to reduce the difference in length between the bonding wires 11 and 12 coupled to the bonding pads 6 and 8 used as the high frequency signal terminals having the same function of the lower semiconductor chip 3 and the upper semiconductor chip 4. This is useful for reducing the difference in inductance between the bonding wires 11 and 12.

The three measures may be performed in a combined manner, or each may be performed alone. The semiconductor device 1 of the present embodiment adopts the structure employing all the three measures.

[Applied Example of Semiconductor Device of the Present Embodiment]

The configuration of the semiconductor device 1 shown up to this point is applicable to various uses, and is in particular preferably applied to a mobile communication device.

Figure 15:
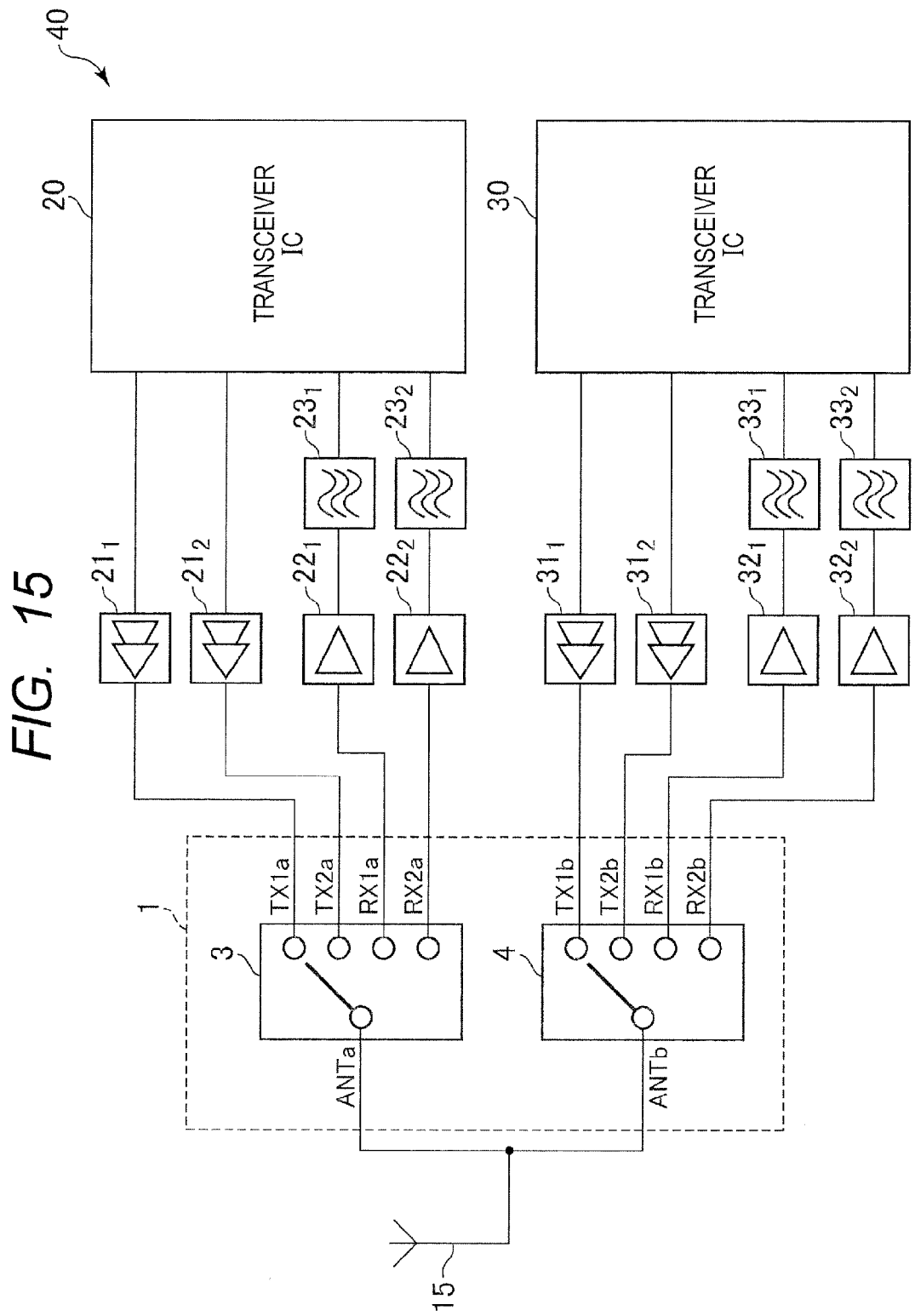
FIG. 15 is a block view showing the configuration of a mobile communication device to which the semiconductor device of the present embodiment is applied.

FIG. 15 is a block diagram showing an example of the configuration of a mobile communication device 40 to which the semiconductor device 1 of the present embodiment is applied.

The mobile communication device 40 of FIG. 15 is configured so as to be adapted for a plurality of mobile communication protocols. The antenna switches SW1 and SW2 integrated in the semiconductor device 1 of the present embodiment are used for switching between the mobile communication protocols, and switching between the transmission operation and the reception operation.

Particularly, the mobile communication device 40 includes, in addition to the semiconductor device 1 of the present embodiment, an antenna 15, transmitting amplifiers $21_1$, $21_2$, $31_1$, and $31_2$, receiving low noise amplifiers $22_1$, $22_2$, $32_1$, and $32_2$, elastic wave filters $23_1$, $23_2$, $33_1$, and $33_2$, and transceiver ICs (integrated circuits) 20 and 30. The antenna 15 is coupled to the antenna terminals ANTa and ANTb of the antenna switches SW1 and SW2 integrated at the lower semiconductor chip 3 and the upper semiconductor chip 4 of the semiconductor device 1. The transmitting amplifiers $21_1$, $21_2$, $31_1$, and $31_2$, the receiving low noise amplifiers $22_1$, $22_2$, $32_1$, and $32_2$, and the elastic wave filters $23_1$, $23_2$, $33_1$, and $33_2$ form a circuit for handling signals inputted to and outputted from the antenna 15.

The transmitting terminals TX1*a* and TX2*a* of the antenna switch SW1 are coupled to the transmission output of the transceiver IC 20 via the transmitting amplifiers $21_1$ and $21_2$, respectively. The receiving terminal RX1*a* is coupled to the reception output of the transceiver IC 20 via the receiving low noise amplifier $22_1$ and the elastic wave filter $23_1$. The receiving terminal RX2*a* is coupled to the reception output of the transceiver IC 20 via the receiving low noise amplifier $22_2$ and the elastic wave filter $23_2$. The transceiver IC 20 performs transmission/reception processings adapted to the first mobile communication protocol (e.g., DCS (digital cellular system) and PCN (personal communication services)).

The transmitting terminals TX1*b* and TX2*b* of the antenna switch SW2 are coupled to the transmission output of the transceiver IC 30 via the transmitting amplifiers $31_3$ and $31_4$, respectively. The receiving terminal RX1*b* is coupled to the reception output of the transceiver IC 30 via the receiving low noise amplifier $32_1$ and the elastic wave filter $33_1$, and the receiving terminal RX2*b* is coupled to the reception output of the transceiver IC 30 via the receiving low noise amplifier $32_2$ and the elastic wave filter $33_2$. The transceiver IC 30 performs transmission/reception processings adapted to the second mobile communication protocol (e.g., GSM (global system for mobile communication)).

When the transceiver IC 20 performs a transmission operation, the antenna 15 is coupled to the transmitting terminal TX1$a$ or TX2$a$ by the antenna switch SW1 of the lower semiconductor chip 3. The transmission signal outputted from the transceiver IC 20 is amplified by the transmitting amplifier $21_1$ or $21_2$ to be supplied to the antenna 15. On the other hand, when the transceiver IC 20 performs a reception operation, the antenna 15 is coupled to the receiving terminal RX1$a$ or RX2$a$ by the antenna switch SW1 of the lower semiconductor chip 3. The reception signal outputted from the antenna 15 is amplified by the receiving low noise amplifier $22_1$ or $22_2$. Further, the components within a specific frequency band of the amplified reception signal pass through the elastic wave filters $23_1$ and $23_2$ to be inputted to the receiving terminal of the transceiver IC 20.

Similarly, when the transceiver IC 30 performs a transmission operation, the antenna 15 is coupled to the transmitting terminal TX1$b$ or TX2$b$ by the antenna switch SW2 of the upper semiconductor chip 4. The transmission signal outputted from the transceiver IC 30 is amplified by the transmitting amplifier $31_1$ or $31_2$ to be supplied to the antenna 15. On the other hand, when the transceiver IC 30 performs a reception operation, the antenna 15 is coupled to the receiving terminal RX1$b$ or RX2$b$ by the antenna switch SW2 of the upper semiconductor chip 4. The reception signal outputted from the antenna 15 is amplified by the receiving low noise amplifier $32_1$ or $32_2$. Further, the components within a specific frequency band of the amplified reception signal pass through the elastic wave filters $33_1$ and $33_2$ to be inputted to the receiving terminal of the transceiver IC 20.

Up to this point, there is presented the configuration of the semiconductor device in which the lower semiconductor chip 3 and the upper semiconductor chip 4 including the antenna switches integrated therein are sealed in a single package. However, the lower semiconductor chip 3 and the upper semiconductor chip 4 including other circuit elements for handling high frequency signals to be inputted to and outputted from the antenna 15, integrated therein, may be sealed in one package in the same structure. For example, the lower semiconductor chip 3 and the upper semiconductor chip 4 including respective twos of the transmitting amplifiers $21_1$, $21_2$, $31_1$, and $31_2$, the receiving low noise amplifiers $22_1$, $22_2$, $32_1$, and $32_2$, and the elastic wave filters (SAW filters) $23_1$, $23_2$, $33_1$, and $33_2$ shown in FIG. 15, integrated therein, may be sealed in a single package in the foregoing structure. Then, the configuration of the semiconductor device of the present embodiment is particularly effective when the same circuit elements are integrated in the lower semiconductor chip 3 and the upper semiconductor chip 4, and the lower semiconductor chip 3 and the upper semiconductor chip 4 are configured as the same chips. For example, the transmitting amplifiers $21_1$ and $21_2$ may be integrated in the lower semiconductor chip 3 and the upper semiconductor chip 4, respectively.

Figure 16:
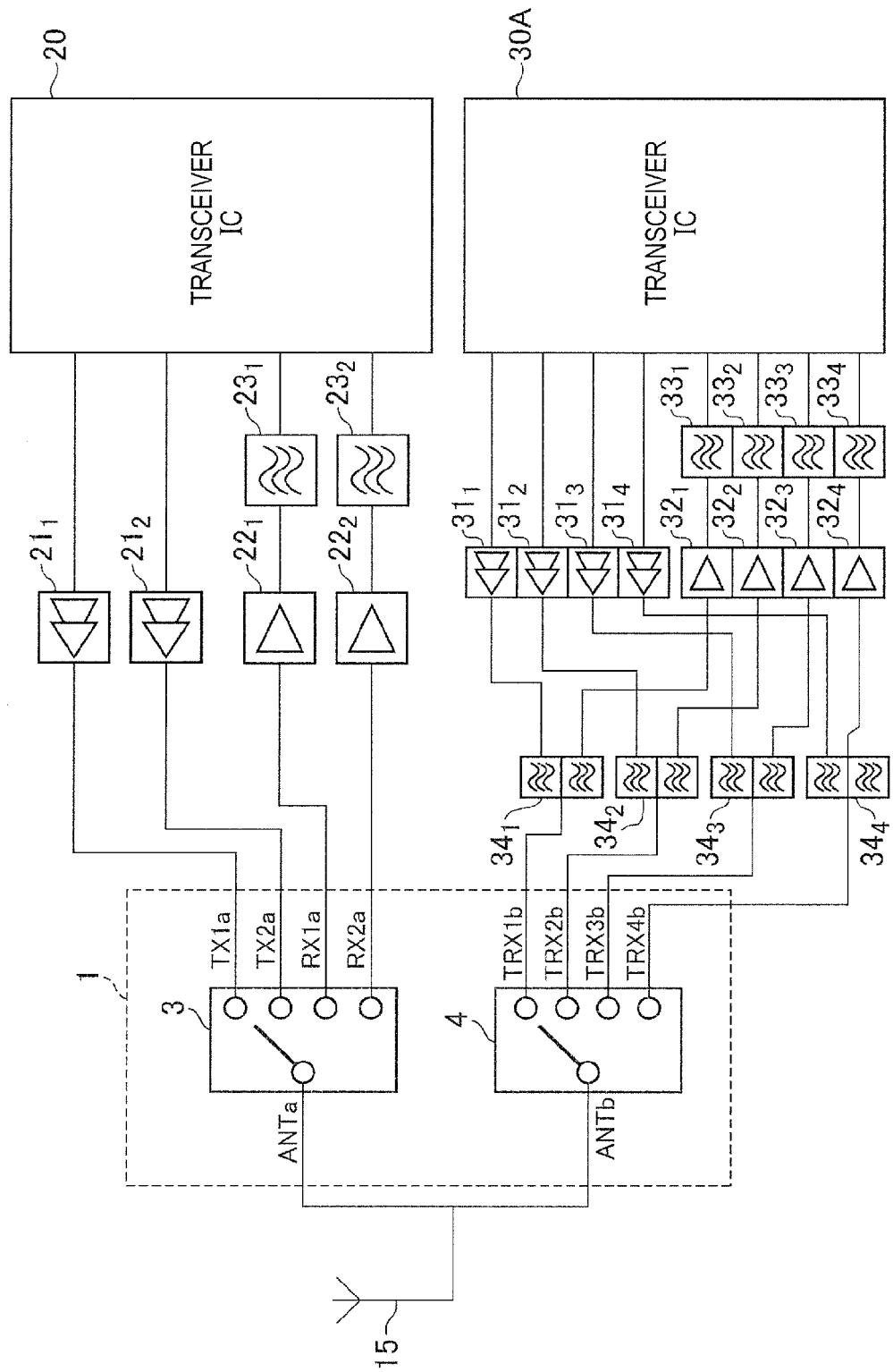
FIG. 16 is a block view showing another configuration of the mobile communication device to which the semiconductor device of the present embodiment is applied.

FIG. 16 is a block view showing another example of application of the semiconductor device 1 of the present embodiment to a mobile communication device. In a mobile communication device 40A of FIG. 16, a transceiver IC 30A adapted to the third generation and fourth generation mobile communication protocols is used in place of the transceiver IC 30 of the mobile communication device 40 of FIG. 15. Herein, with the third generation and fourth generation mobile communication protocols, transmission and reception are performed at difference frequencies, which necessitates a change in circuit configuration.

Figure 17:
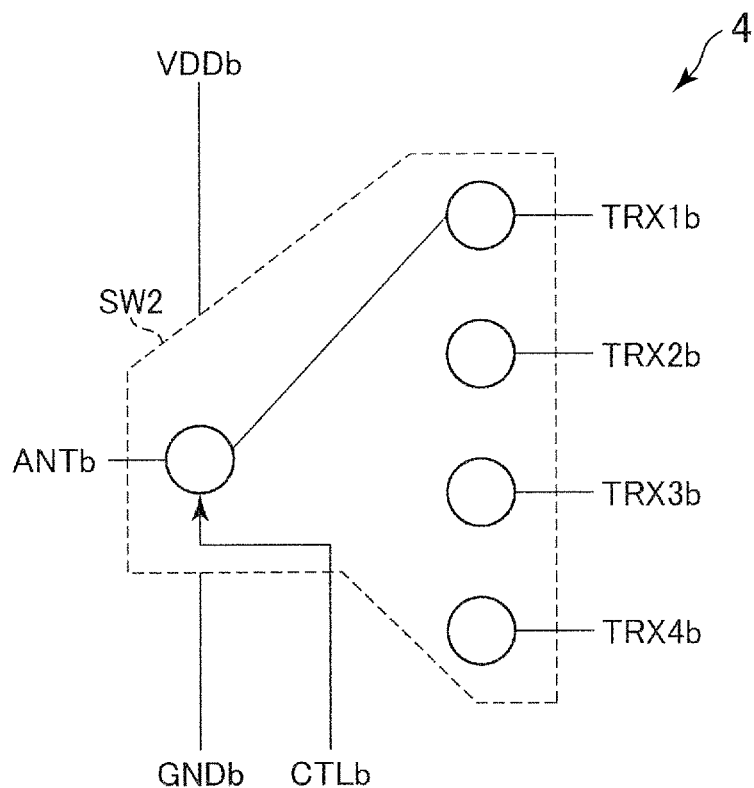
FIG. 17 is a view Showing a circuit integrated on the upper semiconductor chip of the semiconductor device applied to the mobile communication device of FIG. 16.
Figure 18:
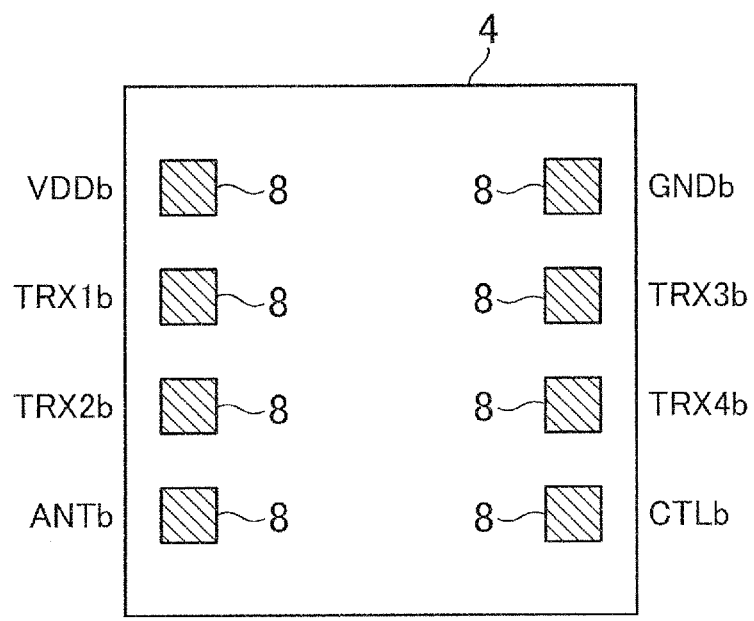
FIG. 18 is a plan view showing the pad arrangement of the upper semiconductor chip of FIG. 17.

More specifically, with the configuration of FIG. 16, the antenna switch SW2 of the upper semiconductor chip 4 performs an operation of coupling the antenna terminal ANTb to any of the four transmitting/receiving terminals TRX1$b$, TRX2$b$, TRX3$b$, and TRX4$b$. Herein, transmitting/receiving terminals TRX1$b$, TRX2$b$, TRX3$b$, and TRX4$b$ are each a terminal for use in both of transmission and reception. FIG. 17 shows the pad arrangement of the upper semiconductor chip 4 in this case. FIG. 18 schematically shows the circuit configuration of the antenna switch SW2 of the upper semiconductor chip 4.

Returning to FIG. 16, between the transmitting/receiving terminals TRX1$b$ to TRX4$b$ and the transceiver IC 30A, there are disposed the transmitting amplifiers $31_1$ to $31_4$, the receiving low noise amplifiers $32_1$ to $32_4$, the elastic wave filters $33_1$ to $33_4$, and duplexers $34_1$ to $34_4$. The duplexers $34_1$ to $34_4$ each has a function of separating a transmission signal and a reception signal located at different frequency bands.

When the transceiver IC 30A performs a transmission operation, the antenna 15 is coupled to any of the transmitting/receiving terminals TRX1$b$, TRX2$b$, TRX3$b$, and TRX4$b$ by the antenna switch SW2 of the upper semiconductor chip 4. The transmission signal outputted from the transceiver IC 30 is amplified by any of the transmitting amplifiers $31_1$ to $31_4$, and is supplied to the antenna 15 via the duplexer 34 coupled to the transmitting amplifier 31 which has amplified the transmission signal, and the antenna switch SW2. On the other hand, when the transceiver IC 30A performs a reception operation, the antenna 15 is coupled to any of the transmitting/receiving terminals TRX1$b$, TRX2$b$, TRX3$b$, and TRX4$b$ by the antenna switch SW2 of the upper semiconductor chip 4. The reception signal outputted from the antenna 15 is separated from the frequency components of the transmission signal by the duplexers $34_1$ to $34_4$, and is inputted to any of the receiving low noise amplifiers $32_1$ to $32_4$ to be further amplified. Further, the component in a specific frequency band of the amplified reception signal passes through any of the elastic wave filters $33_1$ to $33_4$ to be inputted to the receiving terminal of the transceiver IC 30A.

Also with this configuration, it is also possible that other circuit elements than the antenna switches are integrated at the lower semiconductor chip 3 and the upper semiconductor chip 4. For example, the lower semiconductor chip 3 and the upper semiconductor chip 4 including respective twos of the transmitting amplifiers $31_1$ to $31_4$, the receiving low noise amplifiers $32_1$ to $32_4$, the elastic wave filters $33_1$ to $33_4$, and the duplexers (Duplexers) $34_1$ to $34_4$ shown in FIG. 16, integrated therein, may be sealed in a single package in the foregoing structure. Then, the configuration of the semiconductor device of the present embodiment is particularly effective when the same circuit elements are integrated in the lower semiconductor chip 3 and the upper semiconductor chip 4, and the lower semiconductor chip 3 and the upper semiconductor chip 4 are configured as the same chips. For example, the duplexers $34_1$ and $34_2$ may be integrated at the lower semiconductor chip 3 and the upper semiconductor chip 4, respectively.

Up to this point, there was described the embodiment when the lower semiconductor chip 3 and the upper semiconductor chip 4 are the same chips. The foregoing structure disclosed in the present embodiment is most effective when the lower semiconductor chip 3 and the upper semiconductor chip 4 are the same chips. However, the lower semiconductor chip 3 and the upper semiconductor chip 4 are not limited to the same chips. Further, the lower semiconductor chip 3 and the upper semiconductor chip 4 are not required to have the same dimensions.

For example, as shown in FIGS. 19 to 23, it is also acceptable that the lower semiconductor chip 3 and the upper semiconductor chip 24 having different sizes, and different configurations are integrated in the same package. Also in this case, the diameter $d_2$ of the bonding wire 12 to be coupled to the bonding pad 8 of the upper semiconductor chip 24 is set larger than the diameter $d_1$ of the bonding wire 11 to be coupled to the bonding pad 6 of the lower semiconductor chip 3.

Figure 19:
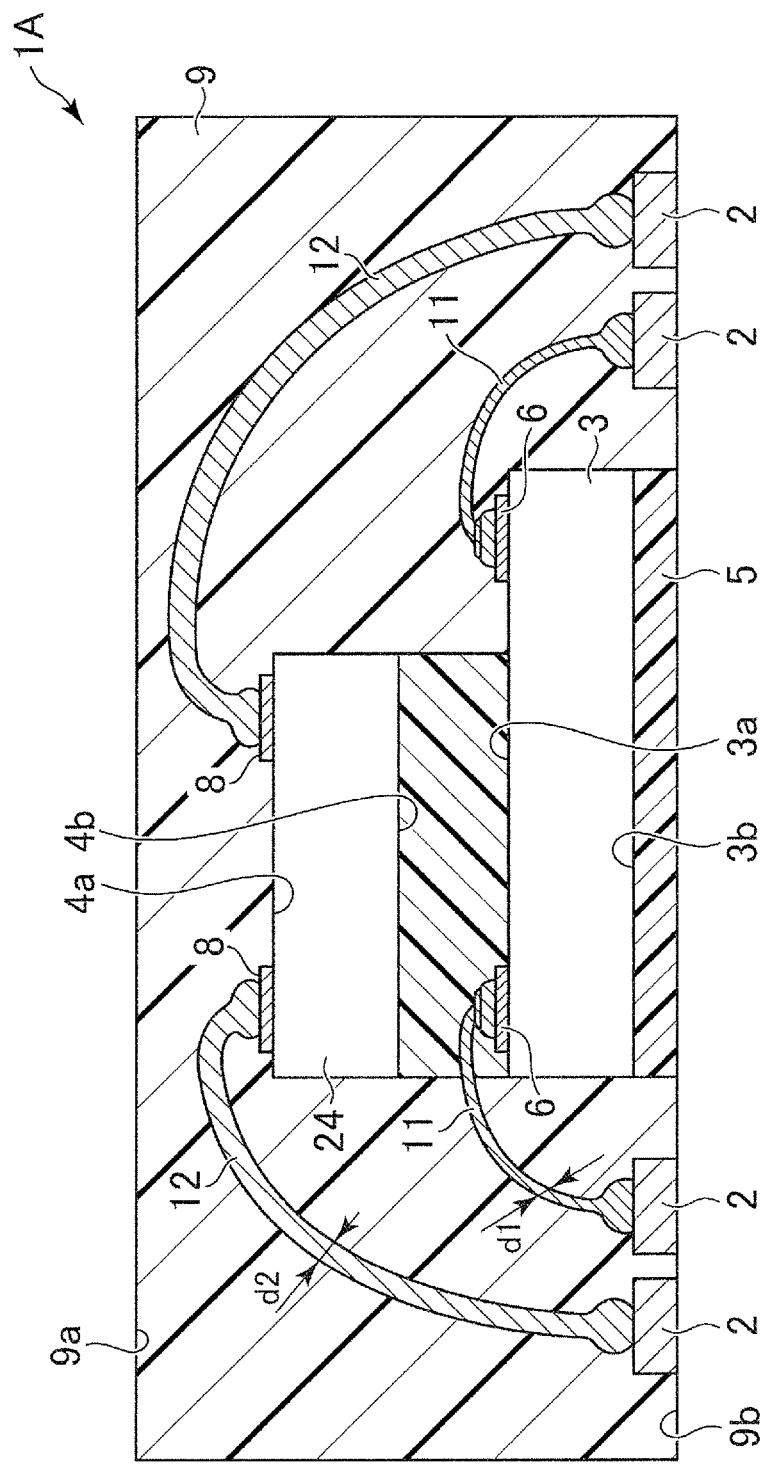
FIG. 19 is a cross-sectional view showing the configuration of a semiconductor device of a still other embodiment.
Figure 20:
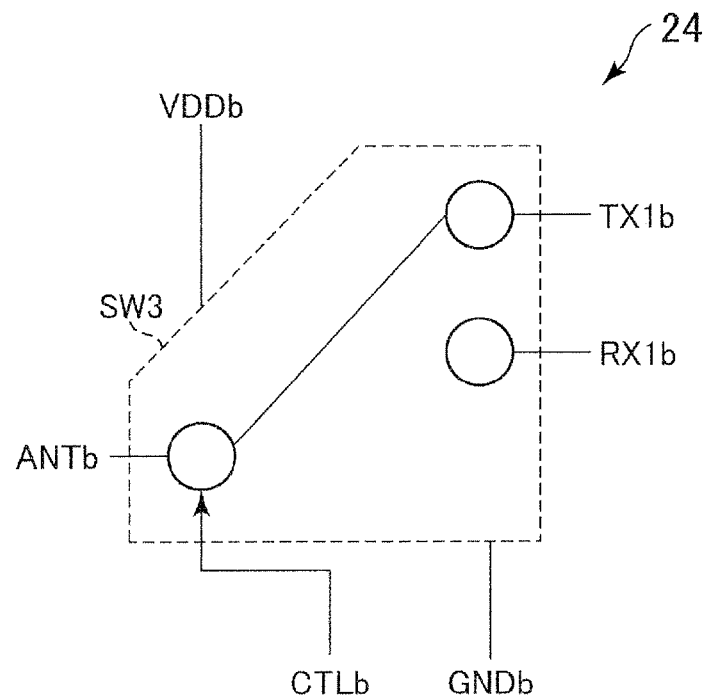
FIG. 20 is a view showing a circuit integrated on the upper semiconductor chip of the semiconductor device of FIG. 19.
Figure 21:
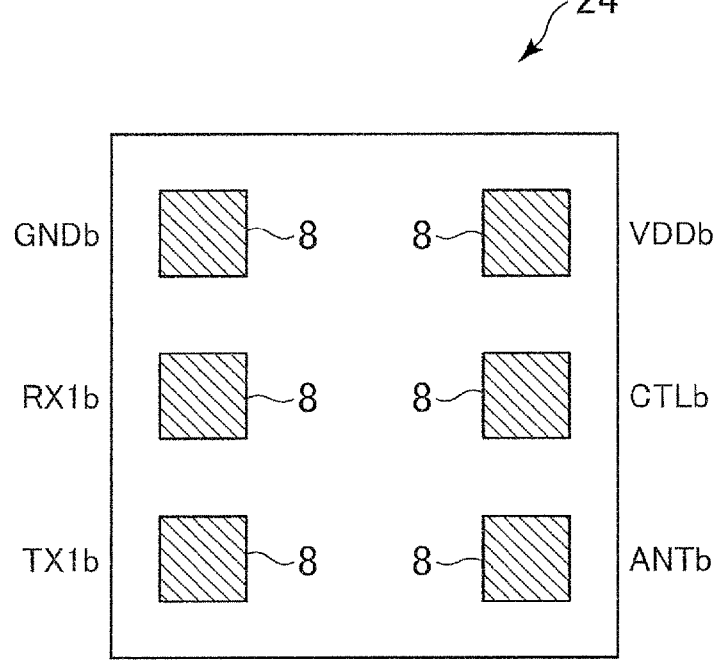
FIG. 21 is a view showing the pad arrangement of the upper semiconductor chip of the semiconductor device of FIG. 19.

Below, the configuration of a semiconductor device 1A including the lower semiconductor chip 3 and the upper semiconductor chip 24 having different sizes and different configurations integrated therein will be described by reference to FIGS. 19 to 21. Herein, FIG. 19 is a cross-sectional view showing the configuration of the semiconductor device 1A including the lower semiconductor chip 3 and the upper semiconductor chip 24 integrated in the same package therein. Whereas, FIG. 20 is a circuit diagram showing a configuration of a circuit integrated on the upper semiconductor chip 24. FIG. 21 is a layout view showing the arrangement of the bonding pads 8 of the upper semiconductor chip 24. Incidentally, the configuration and the pad arrangement of the lower semiconductor chip 3 are as described above by reference to FIGS. 6 and 7.

As shown in FIG. 20, an antenna switch SW3 is integrated on the upper semiconductor chip 4. The antenna switch SW3 has the following six terminals:

ANTb: antenna terminal,
TX1b: transmitting terminal,
RX1b: receiving terminal,
VDDb: power supply terminal,
GNDb: grounding terminal, and
CTLb: control terminal for receiving a control signal from antenna switch SW3.

The antenna switch SW3 has a function of coupling the antenna terminal ANTb to any of the transmitting terminal TX1b and the receiving terminal RX1b in response to the control signal inputted to the control terminal CTLb. In other words, the antenna switch SW3 of the present embodiment has a function of selecting a channel to be actually used from the transmitting channels and the receiving channels.

As shown in FIG. 21, each of the six terminals of the antenna switch SW3 is assigned to any of the bonding pads 8. In the example of FIG. 21, the three bonding pads 8 on the left-hand side column are used as the grounding terminal GNDb, the transmitting terminal TX1b, and the receiving terminal RX1b, respectively. On the other hand, the three bonding pads 8 on the right-hand side column are used as the power supply terminal VDDb, the control terminal CTLb, and the antenna terminal ANTb, respectively.

Figure 22:
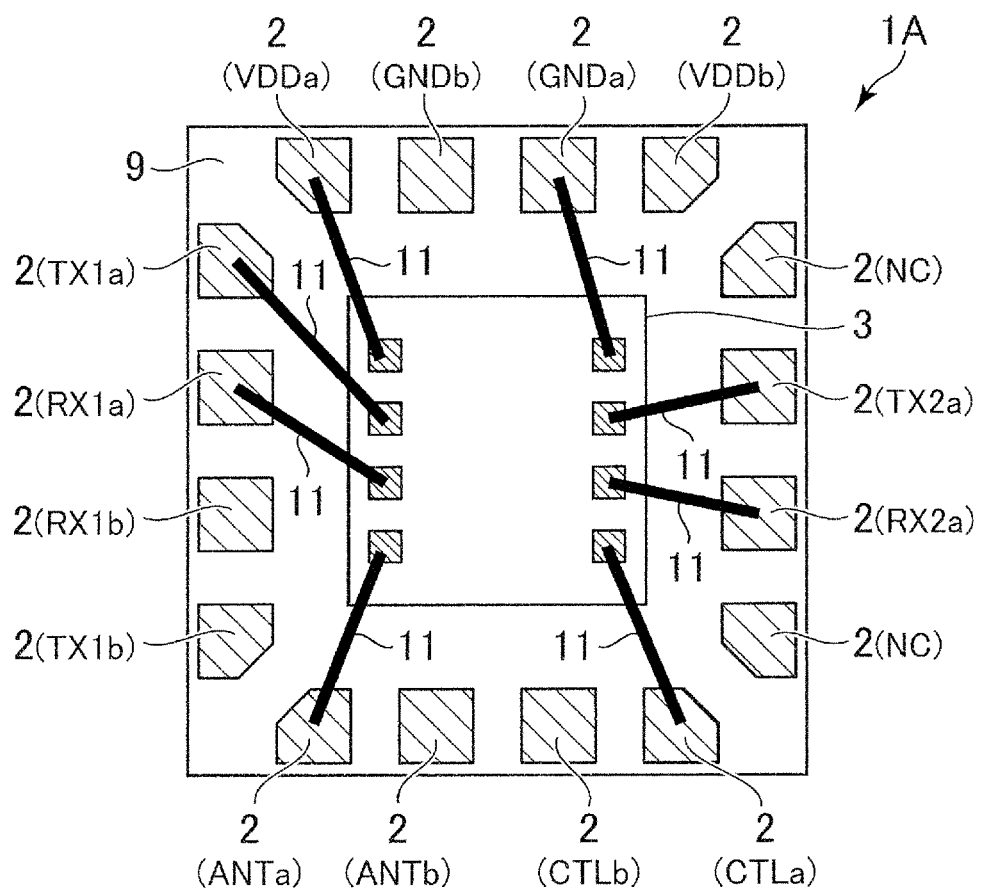
FIG. 22 is a plan view showing the wiring of bonding wires for coupling the bonding pads of the lower semiconductor chip and external terminals, respectively, in the semiconductor device of FIG. 19 (shown with the upper semiconductor chip removed therefrom)
Figure 23:
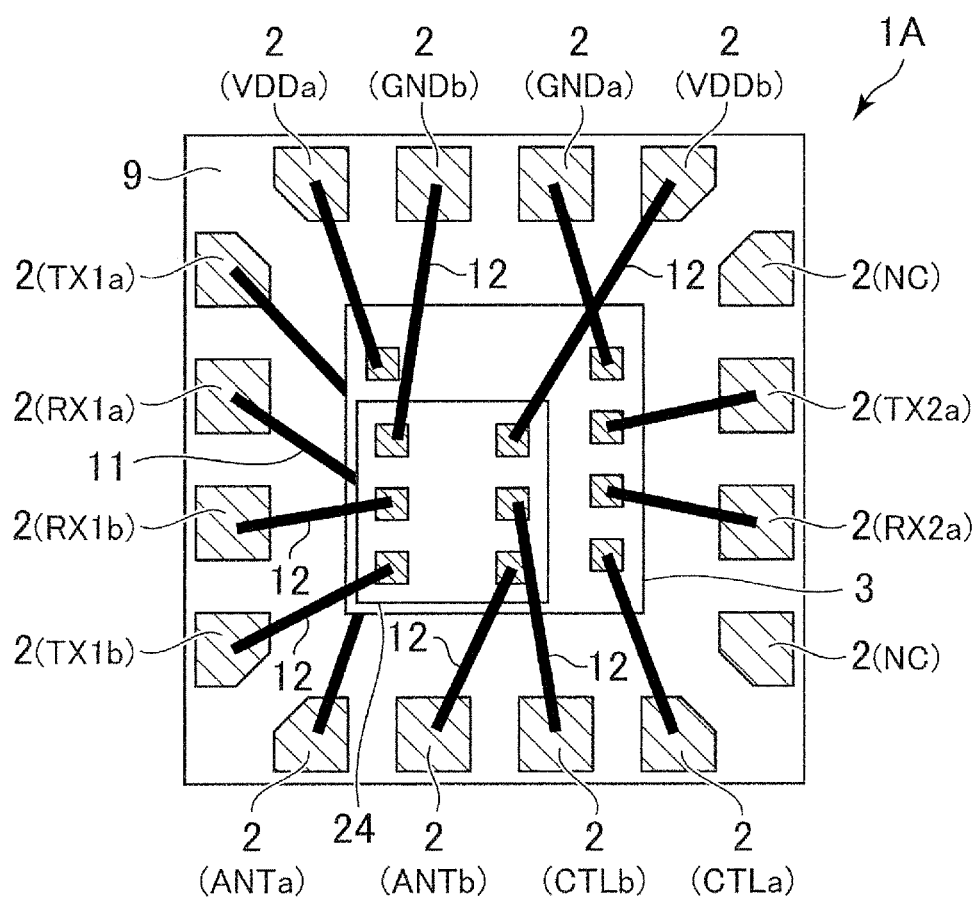
FIG. 23 is a plan view showing the wiring of bonding wires for coupling the bonding pads of the upper semiconductor chip and external terminals, respectively, in the semiconductor device of FIG. 19.

FIGS. 22 and 23 are wiring views showing examples of wiring of the bonding wire 11 to be coupled to the lower semiconductor chip 3, and the bonding wire 12 to be coupled to the upper semiconductor chip 24, respectively. As shown in FIG. 22, in the semiconductor device 1, there are provided external terminals 2 to be coupled to the eight terminals of the antenna switch SW1 of the lower semiconductor chip 3, and the eight terminals of the antenna switch SW3 of the upper semiconductor chip 24, respectively. In the examples of FIGS. 22 and 23, the external terminals 2 to be coupled to the power supply terminal VDDa, the grounding terminals GNDa and GNDb, and the power supply terminal VDDb are arranged side by side along the top side of the lower semiconductor chip 3; and the external terminals 2 to be coupled to the transmitting terminal TX1a, the receiving terminal RX1a, the transmitting terminal TX1b, and the receiving terminal RX1b are arranged side by side along the left side thereof. Further, the antenna terminals ANTa and ANTb, and the control terminals CTLb and CTLa are arranged side by side along the bottom side of the lower semiconductor chip 3; and an external terminal (NC: not connected) 2, the external terminals 2 to be coupled to the transmitting terminal TX2a and the receiving terminal RX2a, respectively, and an external terminal not connected 2 are arranged side by side along the right side thereof (incidentally, the terms "top side", "bottom side", "right side", and "left side" herein used merely represent the positions in FIGS. 22 and 23, and are not related to top, bottom, left, and right in the actual space.)

Each bonding pad 6 of the lower semiconductor chip 3 is electrically coupled to its corresponding external terminal 2 by the bonding wire 11. For example, the bonding pad 6 corresponding to the power supply terminal VDDa of the lower semiconductor chip 3 is coupled to the external terminal 2 corresponding to the power supply terminal VDDa by the bonding wire 11. The same also applies to other bonding pads of the lower semiconductor chip 3. Further, each bonding pad 8 of the upper semiconductor chip 24 is electrically coupled to its corresponding external terminal 2 by the bonding wire 12. For example, the bonding pad 8 corresponding to the power supply terminal VDDb of the upper semiconductor chip 4 is coupled to the external terminal 2 corresponding to the power supply terminal VDDb by the bonding wire 12.

Also in the semiconductor device 1A, the diameter $d_2$ of the bonding wire 12 to be coupled to the bonding pad 8 of the upper semiconductor chip 24 is designed larger than the diameter $d_1$ of the bonding wire 11 to be coupled to the bonding pad 6 of the lower semiconductor chip 3. Such a configuration reduces the difference in inductance between the bonding wires 11 and 12.

[Manufacturing Method of Semiconductor Device]

Below, a description will be given to one example of a manufacturing method of the semiconductor device (1 or 1A) of the present embodiment. Below, a description will be given to the manufacturing method of the semiconductor device 1 in which the lower semiconductor chip 3 and the upper semiconductor chip 4 are the same chips. However, the semiconductor device 1A in which the lower semiconductor chip 3 and the upper semiconductor chip 24 are different chips can also be manufactured by the same manufacturing method.

Figure 24:
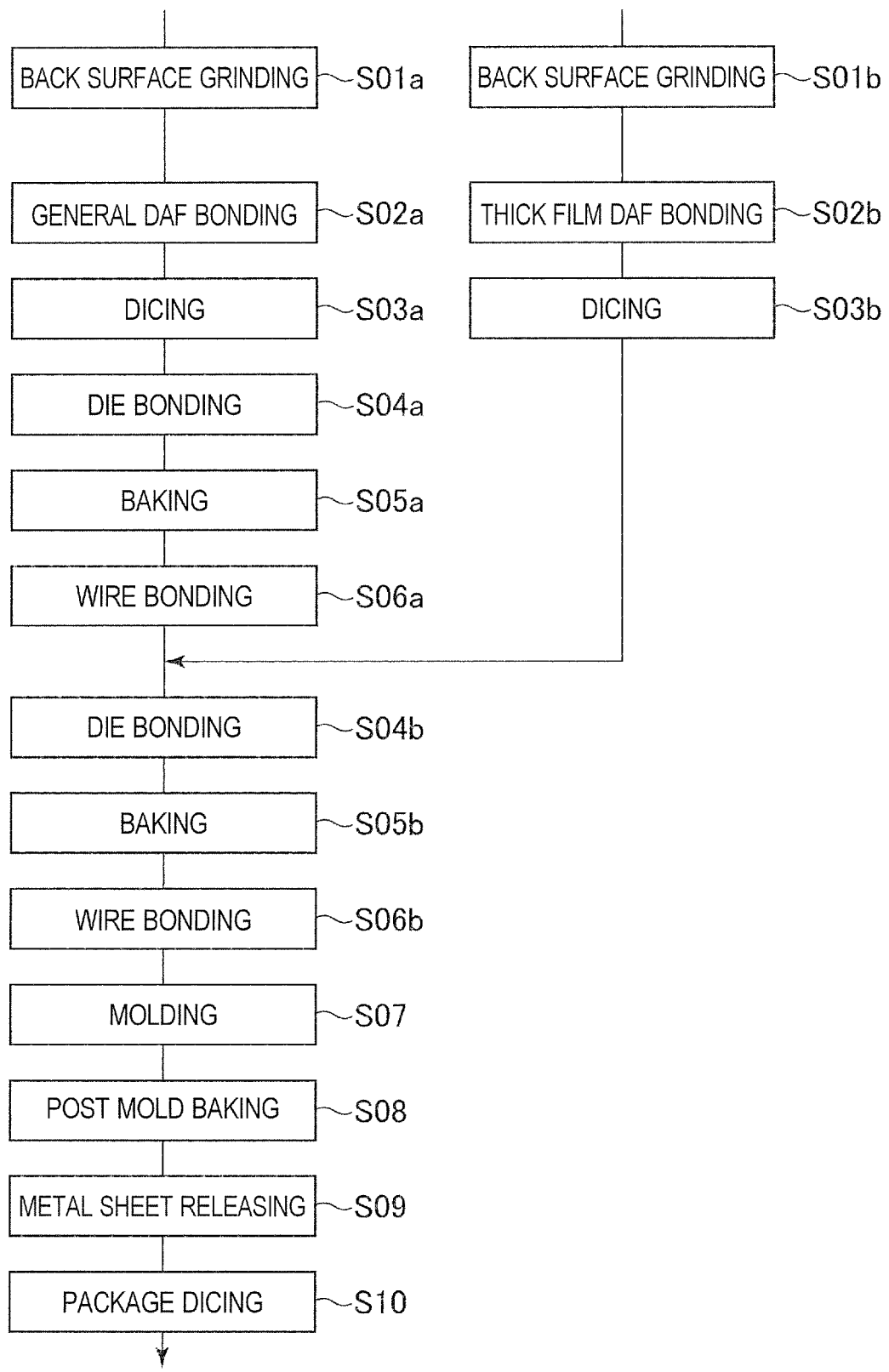
FIG. 24 is a flowchart for illustrating a method for manufacturing the semiconductor device of the present embodiment.

FIG. 24 is a flowchart for illustrating the method for manufacturing the semiconductor device 1 of the present embodiment. FIGS. 25 to 27B are each a cross-sectional view of a wafer during a manufacturing step. FIG. 28 is a perspective view of the wafer during a manufacturing step. FIGS. 29A to 36 are each a cross-sectional view of a package during a manufacturing step.

Figure 25:
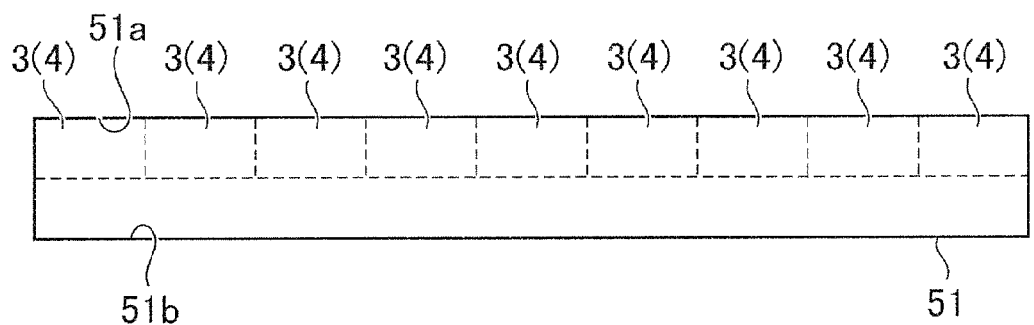
FIG. 25 is a cross-sectional view showing the cross-sectional structure of a wafer during a manufacturing step, for illustrating a wafer preparation step of the method for manufacturing the semiconductor device of the present embodiment.

First, as shown in FIG. 25, there is provided a wafer 51 which has fully undergone a diffusion step. On the front side main surface 51a (i.e., the surface opposite to the back side main surface 51b) of the wafer 51, there are formed circuit elements (in the present embodiment, the antenna switches SW1 and SW2) integrated on the lower semiconductor chip 3 and the upper semiconductor chip 4. Incidentally, in the present embodiment, the lower semiconductor chip 3 and the upper semiconductor chip 4 are collected from different wafers. Namely, in the present embodiment, at least two wafers are provided.

Figure 26:
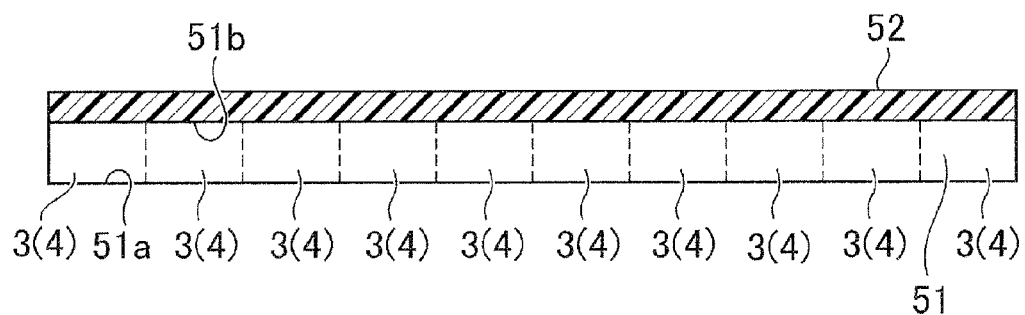
FIG. 26 is a cross-sectional view showing the cross-sectional structure of the wafer during a manufacturing step, for illustrating a back grinding step of the method for manufacturing the semiconductor device of the present embodiment.

Then, as shown in FIG. 26, a BG (back grinding) tape 52 is bonded to the front side main surface 51a of the wafer 51. With the BG tape 52 bonded thereto, back surface grinding of the wafer 51 is performed (steps S01a and S01b of FIG. 24).

Figure 27A:
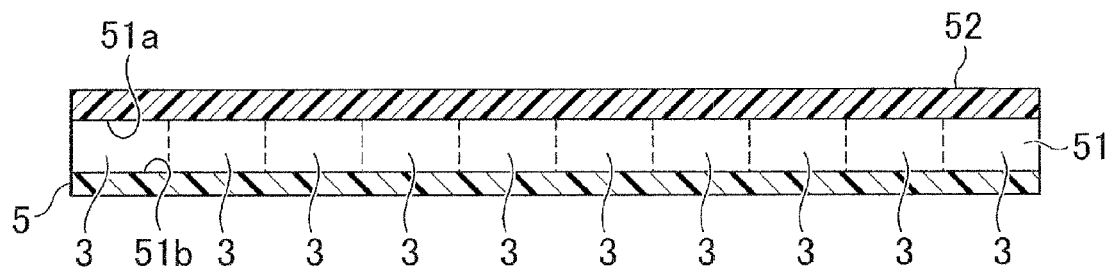
FIG. 27A is a cross-sectional view showing the cross-sectional structure of the wafer during a manufacturing step, for illustrating a DAF bonding step of the method for manufacturing the semiconductor device of the present embodiment.
Figure 27B:
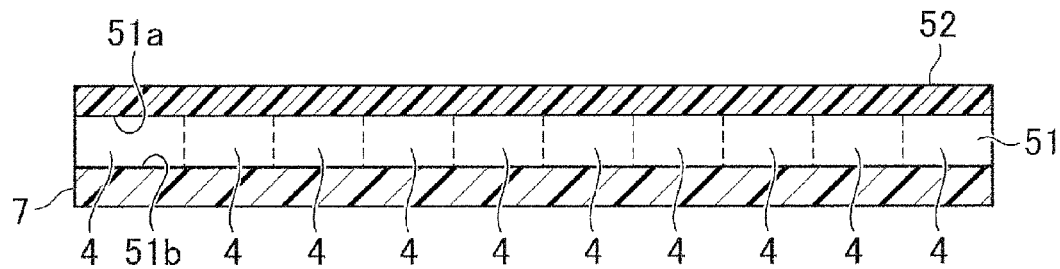
FIG. 27B is a cross-sectional view showing the cross-sectional structure of the wafer during a manufacturing step, for illustrating a DAF bonding step of the method for manufacturing the semiconductor device of the present embodiment.
Figure 28:
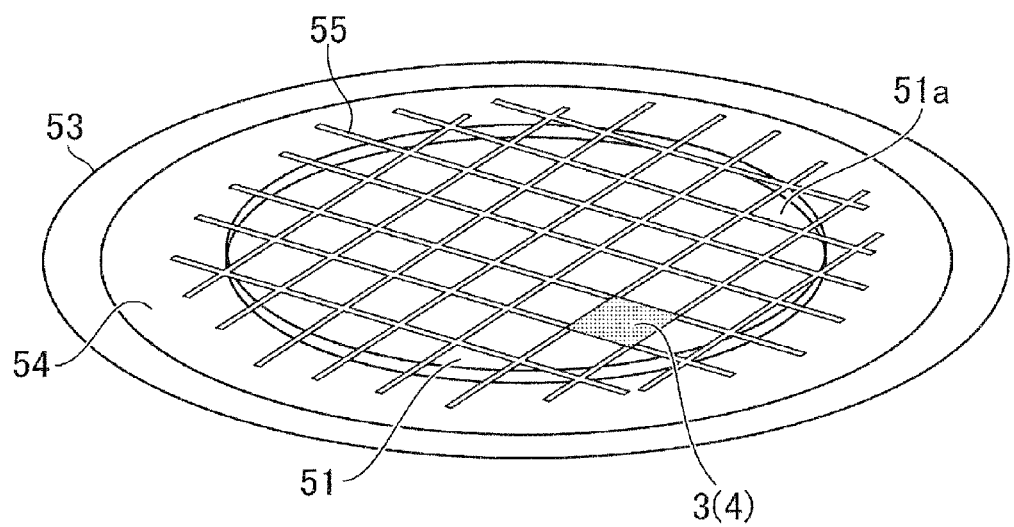
FIG. 28 is a perspective view of the wafer during a manufacturing step and a member for use in dicing, for illustrating the wafer dicing step of the method for manufacturing the semiconductor device of the present embodiment.

Then, as shown in FIG. 27A, a die attach film with a general thickness (e.g., about 30 μm) is bonded as an adhesive layer 5 to the back side main surface 51b of the wafer 51 from which the lower semiconductor chip 3 is collected (step S02a of FIG. 24). On the other hand, as shown in FIG. 27B, a die attach film with a large thickness (e.g., about 60 μm) is bonded as an adhesive layer 7 to the back side main surface 51b of the wafer 51 from which the upper semiconductor chip 24 is collected (step S02b of FIG. 24).

Figure 29A:
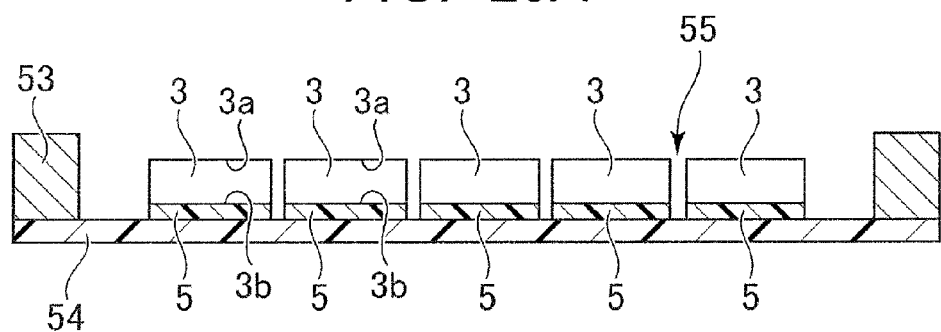
FIG. 29A is a cross-sectional view of the wafer during a manufacturing step and the member for use in dicing, for illustrating the wafer dicing step of the method for manufacturing the semiconductor device of the present embodiment.
Figure 29B:
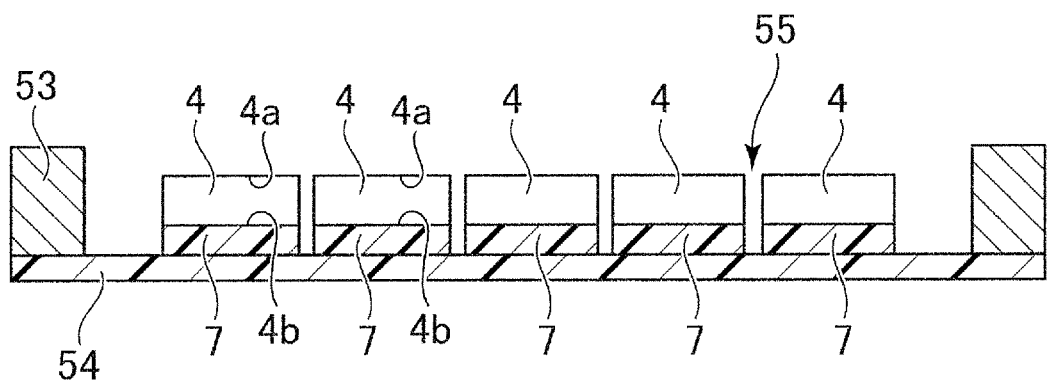
FIG. 29B is a cross-sectional view of the wafer during a manufacturing step and the member for use in dicing, for illustrating the wafer dicing step of the method for manufacturing the semiconductor device of the present embodiment.

Then, as shown in FIG. 28, the wafers 51 from which the lower semiconductor chip 3 and the upper semiconductor chip 4 are collected are fixed to a dicing frame 53 via a dicing tape 54, respectively. Subsequently, in that state, dicing trenches 55 (dicing lines) are formed in two orthogonal directions by means of a rotary blade or the like. As shown in FIGS. 29A and 29B, the wafers 51 are separated into individual lower semiconductor chips 3 and upper semiconductor chips 4 (steps S03a and S03b of FIG. 24).

Figure 30:
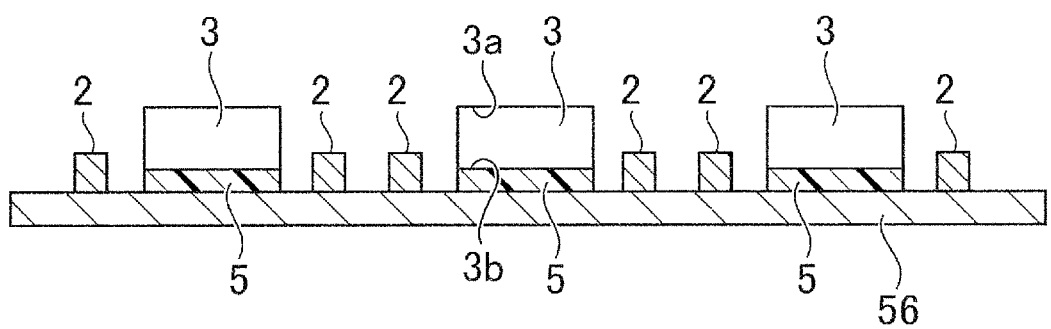
FIG. 30 is a cross-sectional view showing the cross-sectional structure of the semiconductor device during a manufacturing step, for illustrating a die bonding step of the lower semiconductor chip of the method for manufacturing the semiconductor device of the present embodiment.

Then, as shown in FIG. 30, over a metal base sheet 56 (e.g., with a thickness of about 0.15 millimeter) formed of a thin sheet of, for example, stainless steel, a plurality of external terminals 2 are formed by electroplating. Particularly, to the top surface of the cleaned metal base sheet 56, a resist film with a thickness of, for example, about 50 μm is bonded. By the technique of photolithography, an opening pattern corresponding to the external terminal 2 is formed. Subsequently, in the opening, an about 0.3-micrometer gold plating layer is formed by electroplating. The gold plating layer is disposed in order to facilitate the surface mounting of the semiconductor device 1. As the gold plating solution, for example, a non-cyan type gold plating solution including gold sulfite or the like is preferable from the environmental viewpoint. However, a cyan type gold plating solution is also acceptable. A tin plating layer, a solder plating layer, a palladium plating layer, or the like may be formed in place of the gold plating layer. Further, over the gold plating layer, an about 60-μm nickel layer is formed by electroplating. As the nickel plating solution, a nickel sulfamate type one is preferable from the viewpoint of the electroforming process. However, other commonly used nickel plating solutions are also acceptable. Finally, a silver plating layer with a thickness of, for example, 5 μm is formed by electroplating. The silver plating layer is disposed in order to improve the reliability of the wire bonding. Examples of the silver plating solution may include cyan type silver plating solutions. A gold plating layer may be formed in place of the silver plating layer. Then, the resist film is removed. As a result, it is possible to obtain a structure in which each external terminal 2 is formed over the metal base sheet 56. Incidentally, the gold plating layer and the silver plating layer are not essential.

Further, die bonding of the lower semiconductor chip 3 is performed (step S04a of FIG. 24). Particularly, the individually divided lower semiconductor chips 3 over the dicing tape 54 (see FIG. 29A) are picked up. The lower semiconductor chips 3 are die bonded onto the metal base sheet 56 via the adhesive layer 5 so that the front side main surface 3a is up. Incidentally, the die bonding temperature is, for example, 80 degrees centigrade.

Subsequently, there is performed a baking treatment (e.g., about 160 degrees centigrade) for allowing curing of the adhesive layer 5 (formed of a die attach film) to proceed (step S05a of FIG. 24).

Figure 31:
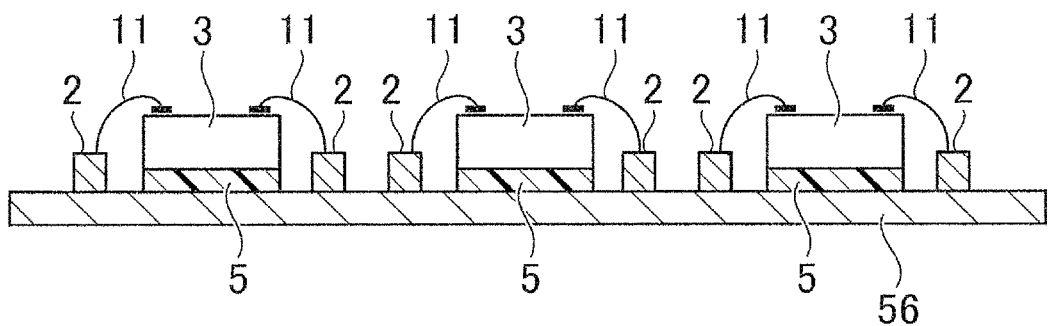
FIG. 31 is a cross-sectional view showing the cross-sectional structure of the wafer during a manufacturing step, for illustrating a wire bonding step of the upper semiconductor chip of the method for manufacturing the semiconductor device of the present embodiment.

Then, as shown in FIG. 31, there is performed wire bonding in which each bonding pad 6 over the front side main surface 3a of the lower semiconductor chip 3 and the external terminal 2 are coupled by the bonding wire 11 (step S06a of FIG. 24). As the bonding wire 11, for example, a gold wire is used. As described above, wire bonding of the lower semiconductor chip 3 is performed with reverse bonding. Namely, as shown in FIG. 4A, to bonding of the bonding wire 11 to the external terminal 2, ball bonding is applied. On the other hand, as shown in FIG. 4B, to bonding of the bonding wire 11 to the bonding pad 6 of the lower semiconductor chip 3, wedge bonding is applied.

Figure 32:
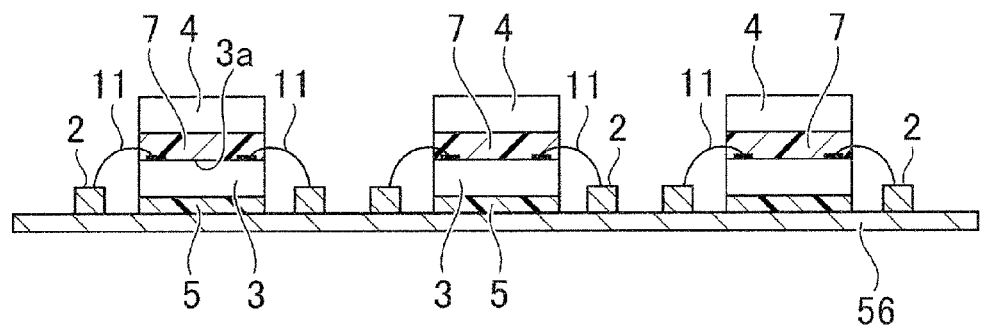
FIG. 32 is a cross-sectional view showing the cross-sectional structure of the semiconductor device during a manufacturing step, for illustrating a die bonding step of the method for manufacturing the semiconductor device of the present embodiment.

Then, as shown in FIG. 32, die bonding of the upper semiconductor chip 4 is performed (step S04b of FIG. 24). Particularly, the individually divided upper semiconductor chips 4 over the dicing tape 54 (see FIG. 29B) are picked up. The upper semiconductor chips 4 are die bonded onto the front side main surface 3a of the lower semiconductor chip 3 via the adhesive layer 7 formed of a die attach film so that the front side main surface 4a is up. At this step, the portion of the bonding wire 11 coupled to the lower semiconductor chip 3 in the vicinity of the bonding pad 6 is embedded in the adhesive layer 7. Incidentally, the die bonding temperature is, for example, about 80 degrees centigrade.

Subsequently, there is performed a baking treatment (e.g., about 160 degrees centigrade) for allowing curing of the adhesive layer 75 (formed of a die attach film) to proceed (step S05b of FIG. 24).

Figure 5B:
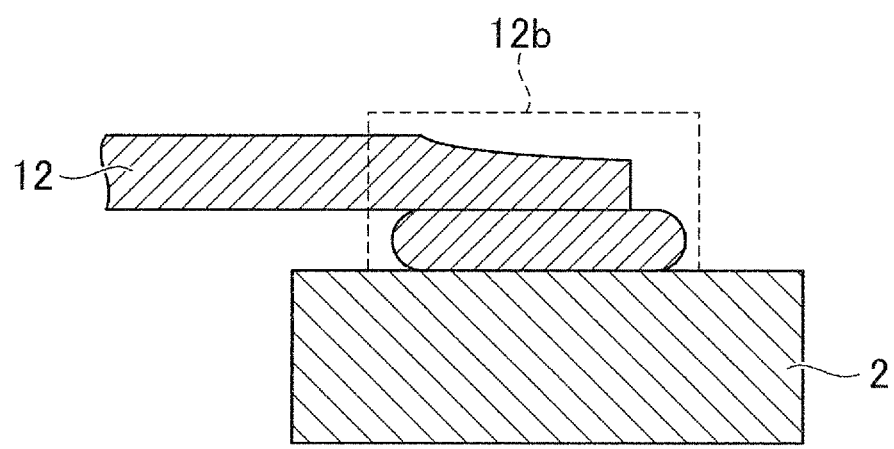
FIG. 5B is a cross-sectional view showing the structure of a coupling part between the bonding wire coupled to the upper semiconductor chip and an external terminal.
Figure 33:
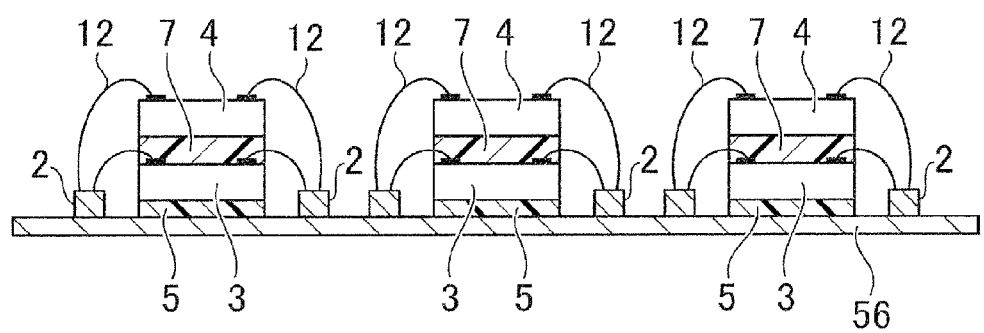
FIG. 33 is a cross-sectional view showing the cross-sectional structure of the semiconductor device during a manufacturing step, for illustrating a wire bonding step of the upper semiconductor chip of the method for manufacturing the semiconductor device of the present embodiment.

Then, as shown in FIG. 33, there is performed wire bonding for coupling the bonding pad 8 over the front side main surface 4a of the upper semiconductor chip 4 and the external terminal 2 by the bonding wire 12 (step S06b of FIG. 24). As described above, the wire bonding is performed with forward bonding. Namely, as shown in FIG. 5A, to bonding of the bonding wire 12 to the bonding pad 8 of the upper semiconductor chip 4, ball bonding is applied. On the other hand, as shown in FIG. 5B, to bonding of the bonding wire 12 to the external terminal 2, wedge bonding is applied.

Figure 34:
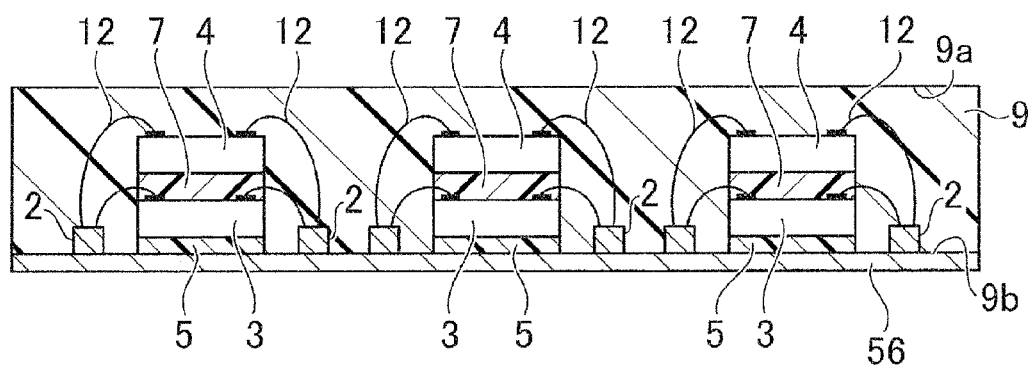
FIG. 34 is a cross-sectional view of the semiconductor device during a manufacturing step, for illustrating a resin sealing step of the method for manufacturing the semiconductor device of the present embodiment.

Then, as shown in FIG. 34, resin sealing is performed on the chip-terminal collective body including the external terminals 2, the lower semiconductor chips 3, the upper semiconductor chips 4, the bonding wires 11 and 12, and the like, integrated over the metal base sheet 56, thereby to form a resin sealing body 9 (step S07 of FIG. 24). The resin sealing is performed in the following manner: the chip-terminal collective body formed over the top surface of the metal base sheet 56 is set in a cavity of a molding die or the like; and further, a molding resin such as an epoxy type resin is injected into the cavity. The resin sealing may be performed with, for example, transfer molding, or may be performed with compression molding.

Subsequently, post mold baking for final curing of the molding resin is performed by, for example, a batch process (step 08 of FIG. 24). As the preferable baking conditions, there can be exemplified about several hours (e.g., about 5 hours) within the range of 170 to 180 degrees centigrade (e.g., 175 degrees).

Figure 35:
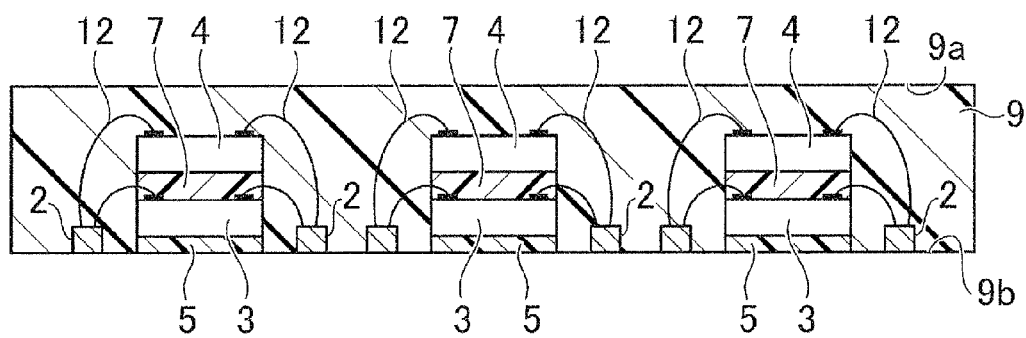
FIG. 35 is a cross-sectional view of the semiconductor device during a manufacturing step, for illustrating a base sheet releasing step of the method for manufacturing the semiconductor device of the present embodiment.

Then, as shown in FIG. 35, there is released the metal base sheet 56 bonded to the back surface 9b of the resin sealing body 9 (step S09 of FIG. 24).

Figure 36:
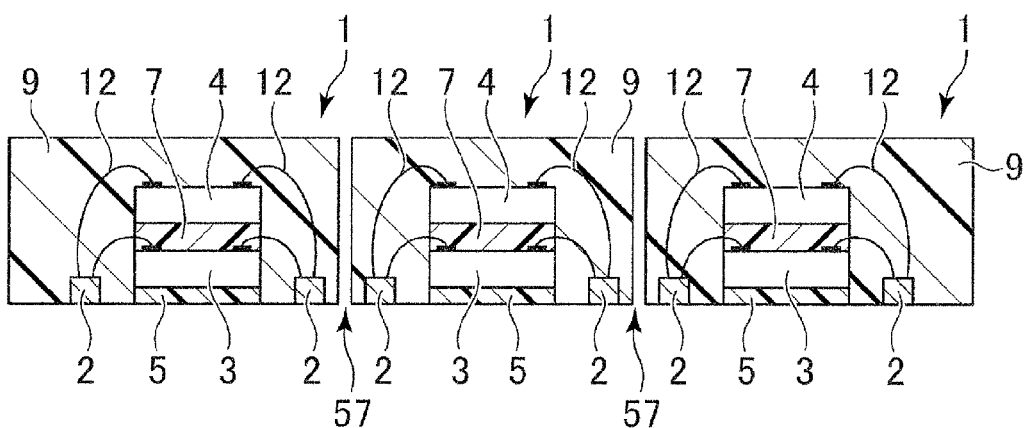
FIG. 36 is a cross-sectional view of the semiconductor device during a manufacturing step, for illustrating a gold package dicing step of the method for manufacturing the semiconductor device of the present embodiment.

Further, as shown in FIG. 36, dicing trenches 57 are formed by, for example, a rotary blade, the resin sealing body 9 is divided into individual semiconductor devices 1 (step S10 of FIG. 24). Up to this point, manufacturing of the semiconductor device 1 of the present embodiment is completed.

Up to this point, the invention made by the present inventors was specifically described by way of embodiments. However, the present invention is not limited to the embodiments. It is naturally understood that the invention may be variously changed within the scope not departing from the gist thereof.

For example, in the embodiment, a non-lead type package was taken as an example, and was specifically described. However, the present invention is not limited thereto, and is also applicable to other packages.

Further, in the embodiment, the module (multi-chip module) in which the semiconductor chips each including the antenna switches integrated therein were stacked was taken as an example, and was specifically described. However, the present invention is not limited thereto, and is also applicable to multi-chip modules for other uses. Further, the combination of the semiconductor chips to be integrated is not limited to the combination of GaAs type semiconductor chips (compound type semiconductor chips). The combination of the semiconductor chips to be integrated in the semiconductor device may be a combination of silicon type chips, or may be a combination of silicon type chips and other compound type semiconductor chips.

Further, in the embodiment, the manufacturing process of the present invention was specifically described by taking the MAP (mold array package) process as an example. However, the present invention is not limited thereto. The present invention is also applicable to an individual sealing type packaging process.

In addition, some of the contents described in the embodiments will be described below.

(1) A semiconductor device includes a first semiconductor chip, a second semiconductor chip, a first external terminal, a second external terminal, a first bonding wire, and a second bonding wire. The first semiconductor chip has a first front side main surface and a first back side main surface, and has a first bonding pad over the first front side main surface. The second semiconductor chip has a second front side main surface and a second back side main surface, is disposed such that the second back side main surface faces the first front side main surface of the first semiconductor chip, and has a second bonding pad over the second front side main surface. The first and second external terminals are disposed so as to be closer to the first front side main surface of the first semiconductor chip than to the second front side main surface of the second semiconductor chip. The first bonding wire couples the first bonding pad and the first external terminal, and the second bonding wire couples the second bonding pad and the second external terminal. Bonding of the first bonding wire to the first external terminal is performed with ball bonding, and bonding of the first bonding wire to the first bonding pad is performed with wedge bonding. Whereas, bonding of the second bonding wire to the second bonding pad is performed with ball bonding, and bonding of the second bonding wire to the second external terminal is performed with wedge bonding.

(2) In the semiconductor device according to the item (1), the loop height of the first bonding wire is larger than the loop height of the second bonding wire.

(3) A semiconductor device includes a first semiconductor chip, a second semiconductor chip, a first external terminal, a second external terminal, a first bonding wire, and a second bonding wire. The first semiconductor chip has a first front side main surface and a first back side main surface, and has a first bonding pad over the first front side main surface. The second semiconductor chip has a second front side main surface and a second back side main surface, is disposed such that the second back side main surface faces the first front side main surface of the first semiconductor chip, and has a second bonding pad over the second front side main surface. The first and second external terminals are disposed so as to be closer to the first front side main surface of the first semiconductor chin than to the second front side main surface of the second semiconductor chip. The first bonding wire couples the first bonding pad and the first external terminal, and the second bonding wire couples the second bonding pad and the second external terminal. The loop height of the first bonding wire is larger than the loop height of the second bonding wire.

(4) In the semiconductor device according to any of the items (1) to (3), the first semiconductor chip and the second semiconductor chip are the same chips.

(5) In the semiconductor device according to any of the items (1) to (4), the first semiconductor chip and the second semiconductor chip each integrate therein circuit elements forming a circuit for dealing with signals to be inputted to, and outputted from an antenna.

(6) In the semiconductor device according to any of the items (1) to (4), the first semiconductor chip and the second semiconductor chip each integrate therein antenna switches to be coupled to the antenna.

(7) In the semiconductor device according to any of the items (1) to (4), the first semiconductor chip and the second semiconductor chip each integrate therein any of a transmitting amplifier for amplifying a transmission signal to be supplied to an antenna, a receiving amplifier for amplifying a reception signal received from the antenna, an elastic wave filter for receiving the reception signal received from the antenna, and a duplexer to be coupled to a transmitting/receiving terminal of an antenna switch to be coupled to the antenna.

(8) In the semiconductor device according to any of the items (1) to (4), a first adhesive layer is bonded to the first back side main surface of the first semiconductor chip, and a second adhesive layer is bonded to the second back side main surface of the second semiconductor chip. The second adhesive layer is thicker than the first adhesive layer. The second bonding wire is embedded in the second adhesive layer in the vicinity of the second bonding pad.

(9) A mobile communication device includes an antenna, and a semiconductor device. The semiconductor device includes a first semiconductor chip, a second semiconductor chip, a first external terminal, a second external terminal, a first bonding wire, and a second bonding wire. The first semiconductor chip has a first front side main surface and a first back side main surface, and has a first bonding pad over the first front side main surface. The second semiconductor chip has a second front side main surface and a second back side main surface, is disposed such that the second back side main surface faces the first front side main surface of the first semiconductor chip, and has a second bonding pad over the second front side main surface. The first and second external terminals are disposed so as to be closer to the first front side main surface of the first semiconductor chip than to the second front side main surface of the second semiconductor chip. The first bonding wire couples the first bonding pad and the first external terminal, and the second bonding wire couples the second bonding pad and the second external terminal. Bonding of the first bonding wire to the first external terminal is performed with ball bonding, and bonding of the first bonding wire to the first bonding pad is performed with wedge bonding. Whereas, bonding of the second bonding wire to the second bonding pad is performed with ball bonding, and bonding of the second bonding wire to the second external terminal is performed with wedge bonding.

(10) In the mobile communication device according to the item (9), the loop height of the first bonding wire is larger than the loop height of the second bonding wire.

(11) A mobile communication device includes an antenna, and a semiconductor device. The semiconductor device includes a first semiconductor chip, a second semiconductor chip, a first external terminal, a second external terminal, a first bonding wire, and a second bonding wire. The first semiconductor chip has a first front side main surface and a first back side main surface, and has a first bonding pad over the first front side main surface. The second semiconductor chip has a second front side main surface and a second back side main surface, is disposed such that the second back side main surface faces the first front side main surface of the first semiconductor chip, and has a second bonding pad over the second front side main surface. The first and second external terminals are disposed so as to be closer to the first front side main surface of the first semiconductor chip than to the second front side main surface of the second semiconductor chip. The first bonding wire couples the first bonding pad and the first external terminal, and the second bonding wire couples the second bonding pad and the second external terminal. The loop height of the first bonding wire is larger than the loop height of the second bonding wire.

(12) In the mobile communication device according to any of the items (9) to (11), the first semiconductor chip and the second semiconductor chip are the same chips, and the circuit elements are antenna switches to be coupled to the antenna.

(13) A method for manufacturing a semiconductor device, includes the following steps of:

providing a first semiconductor chip having a first front side main surface and a first back side main surface, and having a first bonding pad over the first front side main surface, and a second semiconductor chip having a second front side main surface and a second back side main surface, and having a second bonding pad over the second front side main surface, forming first and second external terminals, bonding the first bonding wire in such a manner as to couple the first bonding pad and the first external terminal, bonding the second semiconductor chip to the first semiconductor chip via an adhesive layer such that the second back side main surface faces the first front side main surface of the first semiconductor chip, and such that the first and second external terminals are closer to the first front side main surface of the first semiconductor chip than to the second front side main surface of the second semiconductor chip, and bonding a second bonding wire in such a manner as to couple the second bonding pad and the second external terminal.

Herein, bonding of the first bonding wire to the first external terminal is performed with ball bonding, and bonding of the first bonding wire to the first bonding pad is performed with wedge bonding. Whereas, bonding of the second bonding wire to the second bonding pad is performed with ball bonding, and bonding of the second bonding wire to the second external terminal is performed with wedge bonding.

(14) A method for manufacturing a semiconductor device, includes the following steps of:

providing a first semiconductor chip having a first front side main surface and a first back side main surface, and having a first bonding pad over the first front side main surface, and a second semiconductor chip having a second front side main surface and a second back side main surface, and having a second bonding pad over the second front side main surface, forming first and second external terminals, bonding the first bonding wire in such a manner as to couple the first bonding pad and the first external terminal, bonding the second semiconductor chip to the first semiconductor chip via an adhesive layer such that the second back side main surface faces the first front side main surface of the first semiconductor chip, and such that the first and second external terminals are closer to the first front side main surface of the first semiconductor chip than to the second front side main surface of the second semiconductor chip, and bonding a second bonding wire in such a manner as to couple the second bonding pad and the second external terminal.

Herein, the loop height of the first bonding wire is larger than the loop height of the second bonding wire.

What is claimed is:

1. A semiconductor device, comprising:

a first semiconductor chip having a first front side main surface and a first back side main surface, and having a first bonding pad over the first front side main surface;

a second semiconductor chip having a second front side main surface and a second back side main surface, disposed such that the second back side main surface faces the first front side main surface of the first semiconductor chip, and having a second bonding pad over the second front side main surface;

first and second external terminals disposed so as to be closer to the first front side main surface of the first semiconductor chip than to the second front side main surface of the second semiconductor chip;

a first bonding wire for coupling the first bonding pad with the first external terminal; and a second bonding wire for coupling the second bonding pad with the second external terminal, wherein the loop height of the first bonding wire is larger than the loop height of the second bonding wire.

2. The semiconductor device according to claim 1, wherein the first semiconductor chip and the second semiconductor chip are the same chips.

3. The semiconductor device according to claim 1, wherein the first semiconductor chip and the second semiconductor chip each integrate therein circuit elements forming a circuit for dealing with signals to be inputted to, and outputted from an antenna.

4. The semiconductor device according to claim 2, wherein the first semiconductor chip and the second semiconductor chip each integrate therein antenna switches to be coupled to the antenna.

5. The semiconductor device according to claim 1, wherein bonding of the first bonding wire to the first external terminal is performed with ball bonding, wherein bonding of the first bonding wire to the first bonding pad is performed with wedge bonding, wherein bonding of the second bonding wire to the second bonding pad is performed with ball bonding, and wherein bonding of the second bonding wire to the second external terminal is performed with wedge bonding.

6. The semiconductor device according to claim 1, wherein the diameter of the second bonding wire is larger than the diameter of the first bonding wire only if the second bonding wire is handling a high frequency signal.

7. The semiconductor device according to claim 1, wherein the first semiconductor chip and the second semiconductor chip each integrate therein any of a transmitting amplifier for amplifying a transmission signal to be supplied to an antenna, a receiving amplifier for amplifying a reception signal received from the antenna, an elastic wave filter for receiving the reception signal received from the antenna, and a duplexer to be coupled to a transmitting/receiving terminal of an antenna switch to be coupled to the antenna.

8. The semiconductor device according to claim 1, wherein a first adhesive layer is bonded to the first back side main surface of the first semiconductor chip, wherein a second adhesive layer is bonded to the second back side main surface of the second semiconductor chip, wherein the second adhesive layer is thicker than the first adhesive layer, and wherein the second bonding wire is embedded in the second adhesive layer in the vicinity of the second bonding pad.

9. A semiconductor device, comprising:
a first semiconductor chip having a first front side main surface and a first back side main surface, and having a first bonding pad over the first front side main surface;
a second semiconductor chip having a second front side main surface and a second back side main surface, disposed such that the second back side main surface faces the first front side main surface of the first semiconductor chip, and having a second bonding pad over the second front side main surface;
first and second external terminals disposed so as to be closer to the first front side main surface of the first semiconductor chip than to the second front side main surface of the second semiconductor chip;
a first bonding wire for coupling the first bonding pad with the first external terminal; and
a second bonding wire for coupling the second bonding pad with the second external terminal,
wherein the first semiconductor chip and the second semiconductor chip each integrate therein any of a transmitting amplifier for amplifying a transmission signal to be supplied to an antenna, a receiving amplifier for amplifying a reception signal received from the antenna, an elastic wave filter for receiving the reception signal received from the antenna, and a duplexer to be coupled to a transmitting/receiving terminal of an antenna switch to be coupled to the antenna.

10. A semiconductor device, comprising:
a first semiconductor chip having a first front side main surface and a first back side main surface, and having a first bonding pad over the first front side main surface;
a second semiconductor chip having a second front side main surface and a second back side main surface, disposed such that the second back side main surface faces the first front side main surface of the first semiconductor chip, and having a second bonding pad over the second front side main surface;
first and second external terminals disposed so as to be closer to the first front side main surface of the first semiconductor chip than to the second front side main surface of the second semiconductor chip;
a first bonding wire for coupling the first bonding pad with the first external terminal; and
a second bonding wire for coupling the second bonding pad with the second external terminal,
wherein a first adhesive layer is bonded to the first back side main surface of the first semiconductor chip,
wherein a second adhesive layer is bonded to the second back side main surface of the second semiconductor chip,
wherein the second adhesive layer is thicker than the first adhesive layer, and
wherein the second bonding wire is embedded in the second adhesive layer in the vicinity of the second bonding pad.

11. A mobile communication device, comprising:
an antenna; and
a semiconductor device, coupled to the antenna, comprising:
a first semiconductor chip having a first front side main surface and a first back side main surface, and having a first bonding pad over the first front side main surface;
a second semiconductor chip having a second front side main surface and a second back side main surface, disposed such that the second back side main surface faces the first front side main surface of the first semiconductor chip, and having a second bonding pad over the second front side main surface;
first and second external terminals disposed so as to be closer to the first front side main surface of the first semiconductor chip than to the second front side main surface of the second semiconductor chip;
a first bonding wire for coupling the first bonding pad with the first external terminal; and
a second bonding wire for coupling the second bonding pad with the second external terminal,
wherein the first semiconductor chip and the second semiconductor chip each integrate therein circuit elements forming a circuit for dealing with signals to be inputted to, and outputted from the antenna, and
wherein the loop height of the first bonding wire is larger than the loop height of the second bonding wire.

12. The mobile communication device according to claim 11,
wherein the first semiconductor chip and the second semiconductor chip are the same chips, and
wherein the circuit elements are antenna switches to be coupled to the antenna.

13. The mobile communication device according to claim 11,
wherein the diameter of the second bonding wire is larger than the diameter of the first bonding wire only if the second bonding wire is handling a high frequency signal.

14. The mobile communication device according to claim 11,
wherein the first semiconductor chip and the second semiconductor chip each integrate therein any of a transmitting amplifier for amplifying a transmission signal to be supplied to an antenna, a receiving amplifier for amplifying a reception signal received from the antenna, an elastic wave filter for receiving the reception signal received from the antenna, and a duplexer to be coupled to a transmitting/receiving terminal of an antenna switch to be coupled to the antenna.

15. The mobile communication device according to claim 11,
wherein a first adhesive layer is bonded to the first back side main surface of the first semiconductor chip,
wherein a second adhesive layer is bonded to the second back side main surface of the second semiconductor chip,
wherein the second adhesive layer is thicker than the first adhesive layer, and
wherein the second bonding wire is embedded in the second adhesive layer in the vicinity of the second bonding pad.

16. A method for manufacturing a semiconductor device, comprising the steps of:
providing a first semiconductor chip having a first front side main surface and a first back side main surface, and having a first bonding pad over the first front side main surface, and a second semiconductor chip having a second front side main surface and a second back side main surface, and having a second bonding pad over the second front side main surface;
forming first and second external terminals;

bonding the first bonding wire in such a manner as to couple the first bonding pad with the first external terminal;

bonding the second semiconductor chip to the first semiconductor chip via an adhesive layer such that the second back side main surface faces the first front side main surface of the first semiconductor chip, and such that the first and second external terminals are closer to the first front side main surface of the first semiconductor chip than to the second front side main surface of the second semiconductor chip; and bonding a second bonding wire in such a manner as to couple the second bonding pad with the second external terminal, wherein the loop height of the first bonding wire is larger than the loop height of the second bonding wire.

17. The method for manufacturing a semiconductor device according to claim 16, wherein bonding of the first bonding wire to the first external terminal is performed with ball bonding, wherein bonding of the first bonding wire to the first bonding pad is performed with wedge bonding, wherein bonding of the second bonding wire to the second bonding pad is performed with ball bonding, and wherein bonding of the second bonding wire to the second external terminal is performed with wedge bonding.

18. The method for manufacturing a semiconductor device according to claim 16, wherein the diameter of the second bonding wire is larger than the diameter of the first bonding wire only if the second bonding wire is handling a high frequency signal.

19. The method for manufacturing a semiconductor device according to claim 16, wherein the first semiconductor chip and the second semiconductor chip each integrate therein any of a transmitting amplifier for amplifying a transmission signal to be supplied to an antenna, a receiving amplifier for amplifying a reception signal received from the antenna, an elastic wave filter for receiving the reception signal received from the antenna, and a duplexer to be coupled to a transmitting/receiving terminal of an antenna switch to be coupled to the antenna.

20. The method for manufacturing a semiconductor device according to claim 16, wherein a first adhesive layer is bonded to the first back side main surface of the first semiconductor chip, wherein a second adhesive layer is bonded to the second back side main surface of the second semiconductor chip, wherein the second adhesive layer is thicker than the first adhesive layer, and wherein the second bonding wire is embedded in the second adhesive layer in the vicinity of the second bonding pad.

\* \* \* \* \*